United States Patent
Senda et al.

(10) Patent No.: US 7,880,519 B2
(45) Date of Patent: Feb. 1, 2011

(54) CLOCK SIGNAL GENERATING CIRCUIT, DISPLAY PANEL MODULE, IMAGING DEVICE, AND ELECTRONIC EQUIPMENT

(75) Inventors: Michiru Senda, Kanagawa (JP); Hiroshi Mizuhashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 96 days.

(21) Appl. No.: 12/327,893

(22) Filed: Dec. 4, 2008

(65) Prior Publication Data
US 2009/0146713 A1 Jun. 11, 2009

(30) Foreign Application Priority Data
Dec. 5, 2007 (JP) ............................. 2007-314634

(51) Int. Cl.
*H03L 7/00* (2006.01)
(52) U.S. Cl. .................. 327/161; 327/159; 327/150
(58) Field of Classification Search .................. None
See application file for complete search history.

(56) References Cited

U.S. PATENT DOCUMENTS

| | | | | |
|---|---|---|---|---|
| 4,847,870 A | * | 7/1989 | Butcher | 375/333 |
| 5,355,037 A | * | 10/1994 | Andresen et al. | 327/158 |
| 6,337,590 B1 | * | 1/2002 | Millar | 327/158 |
| 6,437,618 B2 | * | 8/2002 | Lee | 327/158 |
| 6,774,690 B2 | * | 8/2004 | Baker et al. | 327/158 |
| 7,218,158 B2 | * | 5/2007 | Kim | 327/158 |
| 7,242,383 B2 | * | 7/2007 | Zavracky et al. | 345/102 |

FOREIGN PATENT DOCUMENTS

| | | |
|---|---|---|
| JP | 07-015322 | 1/1995 |
| JP | 7-25627 | 5/1995 |
| JP | 11-016345 | 1/1999 |
| JP | 2002-100982 A | 4/2002 |
| JP | 2003-060501 A | 2/2003 |
| JP | 2003-218692 A | 7/2003 |
| JP | 2004-050650 A | 2/2004 |
| JP | 2005-020711 A | 1/2005 |
| JP | 2005-038557 A | 2/2005 |
| JP | 2006-287641 | 10/2006 |
| JP | 2007-006517 | 1/2007 |
| JP | 2003-069424 | 7/2010 |

* cited by examiner

*Primary Examiner*—Cassandra Cox
(74) *Attorney, Agent, or Firm*—SNR Denton US LLP

(57) ABSTRACT

A delay synchronization loop type clock signal generating circuit includes: a digital delay line for delaying a first clock signal and generating a second clock signal; a ring-type shift register for setting the delay time length of the digital delay line by flip-flop output of each stage thereof; and a delay amount control unit for controlling supply of shift clocks to the ring-type shift register, based on phase relation between the first clock signal and the second clock signal.

13 Claims, 36 Drawing Sheets

FIG. 5

| Q1 | Q2 | PHASE STATE |
|---|---|---|
| CONSTANTLY L | CONSTANTLY L | LOCKED STATE |
| H FIRST, DEPENDING ON PHASE DIFFERENCE (L AFTER RESETTING) | DELAYED H, DEPENDING ON PHASE DIFFERENCE (L AFTER RESETTING) | CLK2 IN DELAYED STATE |
| DELAYED H, DEPENDING ON PHASE DIFFERENCE (L AFTER RESETTING) | H FIRST, DEPENDING ON PHASE DIFFERENCE (L AFTER RESETTING) | CLK2 IN ADVANCED STATE |

FIG. 28

| CLK1 | CLK2 | Q1 | Q2 | WNG |
|------|------|-----|-----|-----|
| L | L | L | L | L |
| L | L | L | H | L |
| L | L | H | L | L |
| L | H | L | L | H |
| L | H | L | H | L |
| L | H | H | L | L |
| H | L | L | L | H |
| H | L | L | H | L |
| H | L | H | L | L |
| H | H | L | L | L |
| H | H | L | H | L |
| H | H | H | L | L |

| Q | PHASE STATE |
|---|---|
|  | LOCKED STATE |
| H | STATE WHERE CLK2 IS DELAYED |
| L | STATE WHERE CLK2 IS ADVANCED |

CLOCK SIGNAL GENERATING CIRCUIT, DISPLAY PANEL MODULE, IMAGING DEVICE, AND ELECTRONIC EQUIPMENT

CROSS REFERENCES TO RELATED APPLICATIONS

The present invention contains subject matter related to Japanese Patent Application JP 2007-314634 filed in the Japanese Patent Office on Dec. 5, 2007, the entire contents of which are incorporated herein by reference.

BACKGROUND OF THE INVENTION

1. Field of the Invention

The present invention relates to a delay synchronization loop type signal generating circuit, and in particular, that which is preferably applicable to cases wherein active elements are formed using thin-film formation techniques and printing techniques. The present invention also can serve as a display panel module, an imaging device, and electronic equipment.

2. Description of the Related Art

As of recent, there is demand for high definition display resolution with not only large-screen displays but also middle-to-small range displays as well. Accordingly, higher frequency input clock signals and video signals are being used. For example, with a system display where functional circuits are integrated on a display substrate, signal frequency is reduced by conversion of video signals from serial to parallel, thereby improving operating margin with regard to lower power consumption and property irregularities of thin-film transistors.

SUMMARY OF THE INVENTION

However, with recent system displays where the input frequency of video signals is very high, difference in delay between the video signal and the clock signal occurring at the display substrate is no longer negligible.

An example of a delay synchronization loop type signal generating circuit is disclosed in Japanese Patent Application Publication Nos. 2006-287641 and 2007-6517.

A method has been conceived to reduce the delay difference between clock signals and video signals by using a phase regulator circuit such as a PLL (phase-locked loop) or DLL (delay-locked loop) circuit so as to approximate zero for the delay difference.

However, there is a problem with forming or printing active elements making up the clock signal generating circuit on the insulating substrate as thin-film transistors, in that inclusion on the panel is difficult due to the circuit scale thereof. This is due to the fact that the device size of thin-film transistor devices formed on printed on the insulating substrate is greater in comparison with transistors formed on a silicon (semiconductor) substrate. Particularly, a problem can be easily foreseen where the circuit scale becomes great in the event of configuring portions regarding which delay amount is to be set in the form of digital circuits. Increased circuit scale leads to poor theoretical yield, which in turn leads to increased costs.

A delay synchronization loop type clock signal generating circuit according to an embodiment of the present invention includes: a digital delay line for delaying a first clock signal and generating a second clock signal; a ring-type shift register for setting the delay time length of the digital delay line by flip-flop output of each stage thereof; and a delay amount control unit for controlling supply of shift clocks to the ring-type shift register, based on phase relation between the first clock signal and the second clock signal.

The digital delay line may be configured of a serial connection of a first delay line for coarse adjustment of delay time, and a second delay line for fine adjustment of delay time; with the ring-type shift register configured of a first ring-type shift register corresponding to the first delay line, and a second ring-type shift register corresponding to the second delay line; and with the delay amount control unit configured of a first delay amount control unit corresponding to the first delay line, and a second delay amount control unit corresponding to the second delay line.

That is to say, the delay line is preferably of a two-stage configuration for coarse adjustment and fine adjustment, with ring-type shift registers and delay control units being provided to each stage. In this case, phase synchronization can be performed in a shorter time as compared with delay amount adjustment operations with a single delay line.

Further, the shift clock which drives the first and second ring-type shift registers may have a frequency lower than the first clock signal or the second clock signal. For example, the shift clock signal may be provided as frequency division output of the first clock signal. Using a shift lock with a low frequency in this way allows the operating margin of the shift register to improve. Accordingly, yield can be improved and manufacturing costs reduced.

The frequency of the first shift lock signal input to the first ring-type shift register may be lower than the frequency of the second shift lock signal input to the second ring-type shift register. That is to say, setting frequency of the first shift lock signal input to the first ring-type shift register so as to be lower than the frequency of the second shift lock signal input to the second ring-type shift register ultimately enables the operating margin of the coarse shift register to be higher than the operating margin of the fine shift register.

In a case that new phase difference occurs in a state in which both coarse adjustment and fine adjustment delay time lengths have been set, first, only setting operations for fine adjustment delay time length may be resumed. This operation can be realized by frequency difference of the coarse adjusting and fine adjusting shift clocks.

The digital delay line may be configured of a serial connection of a first delay line for coarse adjustment of delay time, and a second delay line for fine adjustment of delay time; with the ring-type shift register performing setting of the delay time length of the first delay line, and the digital delay amount setting unit performing setting of the delay time length of the second delay line.

That is to say, the delay line is preferably of a two-stage configuration for coarse adjustment and fine adjustment, with a ring-type shift register and a delay control unit being provided to at least the coarse adjustment stage. In this case, just coarse adjustment of delay time length can be realized with the ring type shift register, and fine adjustment of delay time length can be realized with another delay adjusting circuit including related art.

In this case as well, the shift clock which drives the ring-type shift register may have a frequency lower than the first clock signal or the second clock signal. Using a shift lock with a low frequency in this way allows the operating margin of the shift register to improve.

In a case that new phase difference occurs in a state in which both coarse adjustment and fine adjustment delay time lengths have been set, first, only setting operations for fine adjustment delay time length may be resumed. This operation can be realized by frequency difference of the coarse adjusting and fine adjusting shift clocks.

Unlike the earlier example, with a case where the delay line is configured with a single delay line as well, the shift clock which drives the ring-type shift register may have a frequency lower than the first clock signal or the second clock signal. In this case, the shift clock signal may be provided as frequency division output of the first clock signal.

Also proposed are a display panel module, imaging apparatus, and electronic equipment. The panel module may be configured of a display panel, a clock signal generating circuit of a configuration described above, and a driving circuit for driving the display panel based on the second clock signal which is the output clock thereof.

The active elements of the clock signal generating circuit may be thin-film transistors formed or printed on an insulating substrate. The display panel preferably is a liquid display panel or organic EL panel, for example.

Also, an imaging apparatus according to an embodiment of the present invention includes: an imaging device; a clock signal generating circuit of a configuration described above; and a driving circuit for driving the imaging device based on the second clock signal which is the output clock of the clock signal generating circuit.

Also, electronic equipment according to an embodiment of the present invention includes: a clock signal generating circuit of a configuration described above; a system control unit for controlling operations of the entire system; and an operation input unit for accepting operation input to the system control unit.

Applying the clock signal generating circuit of the configuration described above enables small circuit scale to be realized in a case of forming the circuit with thin-film transistors with high on resistance. Particularly, the greater the number of delay stages is, the more the circuit scale can be reduced in comparison with that of the related art.

BRIEF DESCRIPTION OF THE DRAWINGS

FIG. 5 is a diagram for describing the operating state of a phase comparison circuit;

FIG. 28 is a diagram illustrating the input/output relation of the pseudo lock detecting unit;

DESCRIPTION OF THE PREFERRED EMBODIMENTS

Figure 1:
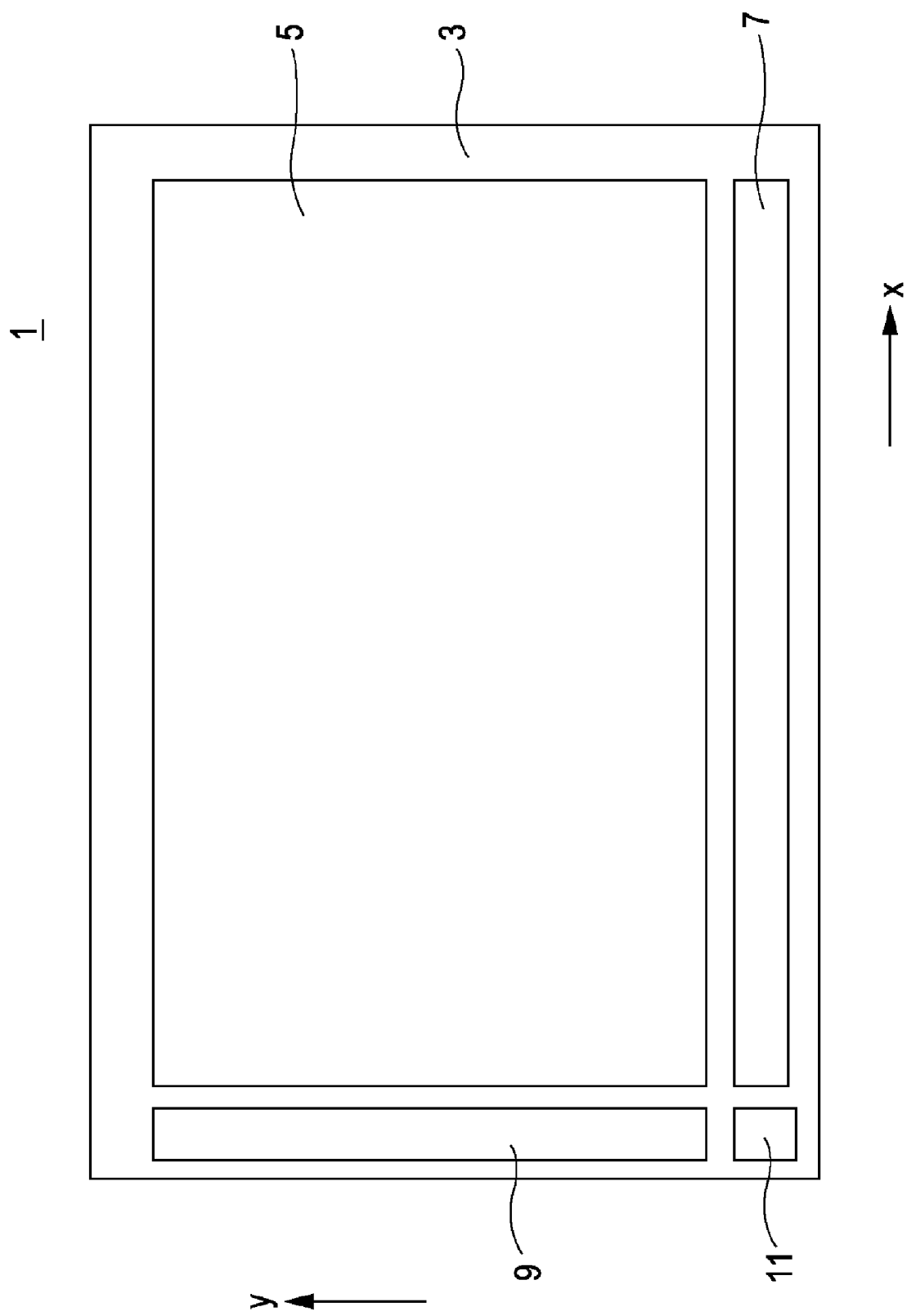
FIG. 1 is a diagram illustrating a plan configuration example of a display panel.

Cases of applying the present invention to a system display will be described. Note that portions not particularly illustrated in the drawings or description in the Specification should be assumed to be applying related art. Also note that the following description is but embodiments of the present invention, and that the present invention is not restricted thereby.

A First Embodiment

The following is a description regarding a case wherein the display panel is a liquid crystal display panel.

A-1 Configuration of Display Panel

FIG. 1 illustrates a plan view configuration of a display panel 1 to be described in the present embodiment. In the case of this embodiment, a display region 5 and the peripheral circuits thereof are formed together with the same process on the face of the glass substrate 3. That is to say, we will assume a case wherein the display panel 1 is a system panel.

Gate lines and signal lines are formed in lattice form on the display region 5 in accordance with the resolution, and pixel circuits are formed at each intersection position thereof. That is to say, the display region 5 has a panel configuration corresponding to the active matrix driving method. Note that gate lines are wiring extending in the x direction of the display region, and signal lines are wiring extending in the y direction of the display region.

At each pixel circuit, a switching transistor configured of a thin-film transistor, and a retentive capacity Cs for holding signal voltage written thereto, are formed. Note that the gate electrode of the switching transistor is connected to the gate line, and one main electrode is connected to the signal line, while the other main electrode is connected to a pixel electrode.

The pixel electrode generates an electric field between itself and an unshown facing electrode, variably controlling the alignment direction with this electric field. Note that in the case of the present embodiment, the structure of the pixel circuit is irrelevant. For example, the embodiment may be applied to a method wherein the pixel electrodes and facing electrode are provided of different panel substrates so as to face one another, IPS (In-Plane Switching) where the pixel electrodes and facing electrode are provided on the same panel substrate, or other methods as well.

Formed around the display region 5 are a signal line driver 7, gate line driver 9, clock signal generating circuit 11, and so forth, as functional circuits. The signal line driver 7 is a driving circuit for applying signal voltage according to write timing to the corresponding signal lines. The signal line driver 7 is configured of a shift register of a number of flip-flops equivalent to the number of pixels in the x direction, digital/analog conversion circuits for latching the signal values at the output of each flip-flop and converting the latch output to analog voltage, and so forth.

The gate driver 9 is a driving circuit for sequentially providing gate lines with the write timing of the signal voltage. The gate driver 9 is configured of a number of flip-flops equivalent to the number of pixels in the y direction. The signal line driver 7 and the gate driver 9 are driven by clock signals provided from the clock signal generating circuit 11 (later-described CLK2).

Incidentally, the clock signal generating circuit 11 is a circuit to which an input clock, synchronized with the video signal, is input, and an output clock CLK2 synchronized with the input clock CLK1 as described later is generated. In the case of this embodiment, the active elements making up the clock signal generating circuit 11 have been formed on the glass substrate 3, which is an insulating substrate, using a semiconductor process.

Additionally, a power supply TCP 13 is disposed on the glass substrate 3. These wirings are flexible wirings, connected to the power supply line within the display region via connection pads. Driving signals to the signal line driver 7, gate line driver 9, and clock signal generating circuit 11, are supplied via unshown wiring. Incidentally, an unshown facing glass 15 is disposed on the face of the glass substrate 3 which is the lower substrate, so as to seal in the liquid crystal layer.

A-2 Configuration of Clock Signal Generating Circuit

Figure 2:
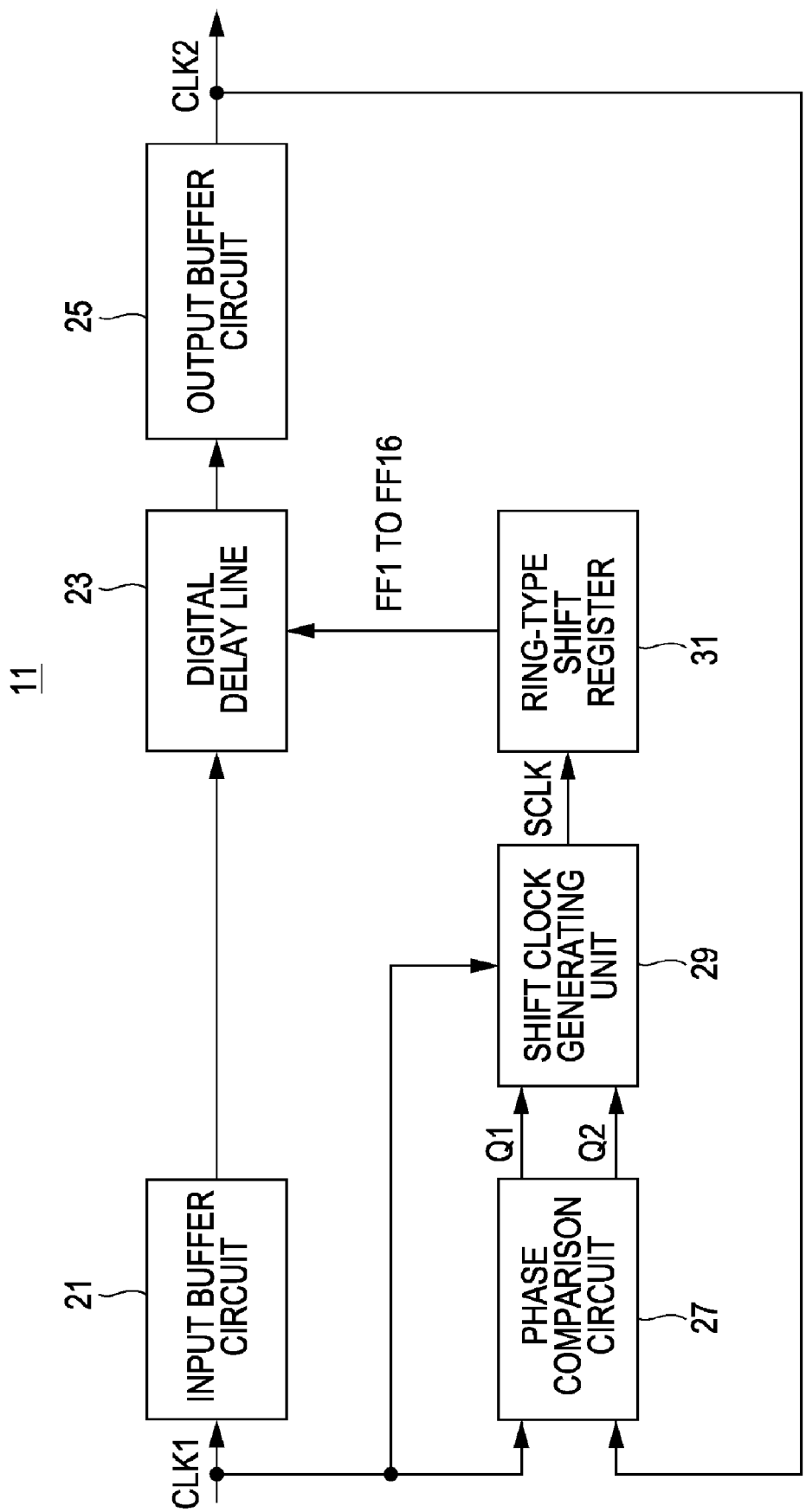
FIG. 2 is a diagram illustrating a configuration example of a clock signal generating circuit according to a first embodiment.

FIG. 2 illustrates an internal configuration example of a delay synchronization loop type clock signal generating circuit 11, proposed by the present Inventors in the present Specification. This clock signal generating circuit 11 is configured of an input buffer circuit 21, a digital delay line 23, an output buffer circuit 25, a phase comparison circuit 27, a shift clock generating unit 29, and a ring-type shift register 31.

The input buffer circuit 21 and the output buffer circuit 25 are each circuits wherein multiple inverter circuits are connected serially. The input clock CLK1 input to the input buffer circuit 21 will also be referred to as "first clock", and the output clock CLK2 output from the output buffer circuit 27 will also be referred to as "second clock".

The digital delay line 23 is a delay line capable of digital control of the delay amount of the input clock CLK1. With the present embodiment, a digital delay line 23 which switches the delay amount of each inverter circuit in a binary manner will be used.

Figure 3:
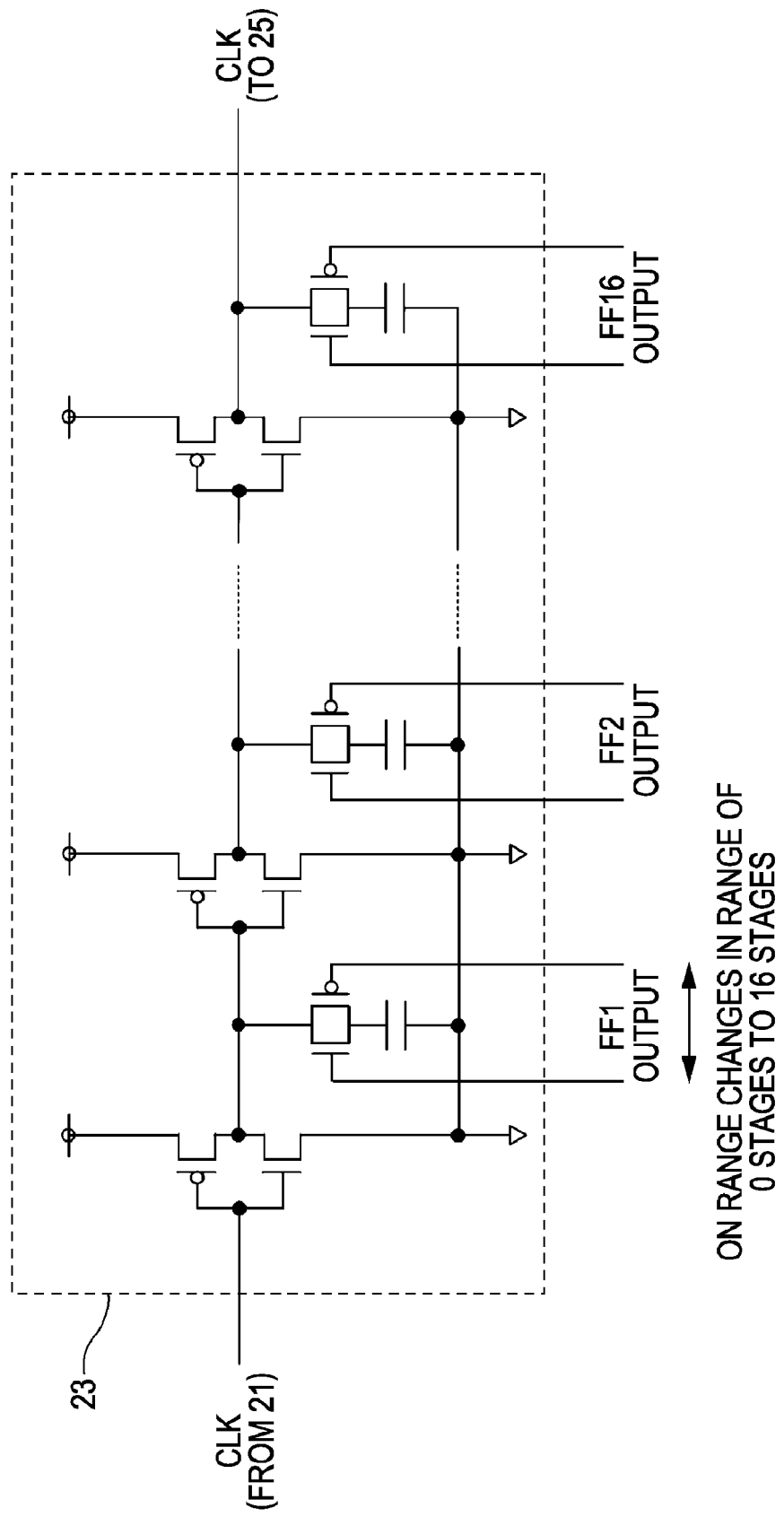
FIG. 3 is a diagram illustrating a configuration example of a digital delay line.

FIG. 3 illustrates a circuit example of the digital delay line 23. The digital delay line 23 is configured of a serial connection circuit of CMOS inverter circuits having load capacitance. In the case of this embodiment, the number of connected CMOS inverters is 16 stages. Note however, that a CMOS switch is disposed between each output terminal of the CMOS inverter circuits and the ground line, providing a structure such that switching between the propagation path and load capacitance path can be switched over.

Moreover, opening and closing of each switch is executed by a later-described ring-type shift register 31, with a configuration such that the number of load capacitances connected to the transmission line can be increased or decreased in a range between zero to 16. Note that the delay time is the shortest when all CMOS switches are controlled open (all CMOS switches are controlled off). The delay amount on the digital delay line 23 incrementally increases with each load capacitance connected to the transmission path. Accordingly, the delay time is the longest when all CMOS switches are controlled closed (all CMOS switches are controlled on).

The phase comparison circuit 27 is a circuit for comparing the edge phase of the input clock CLK1 and the edge phase of the output clock CLK2, and outputting determination outputs Q1 and Q2 in accordance with the comparison relation downstream.

Figure 4:
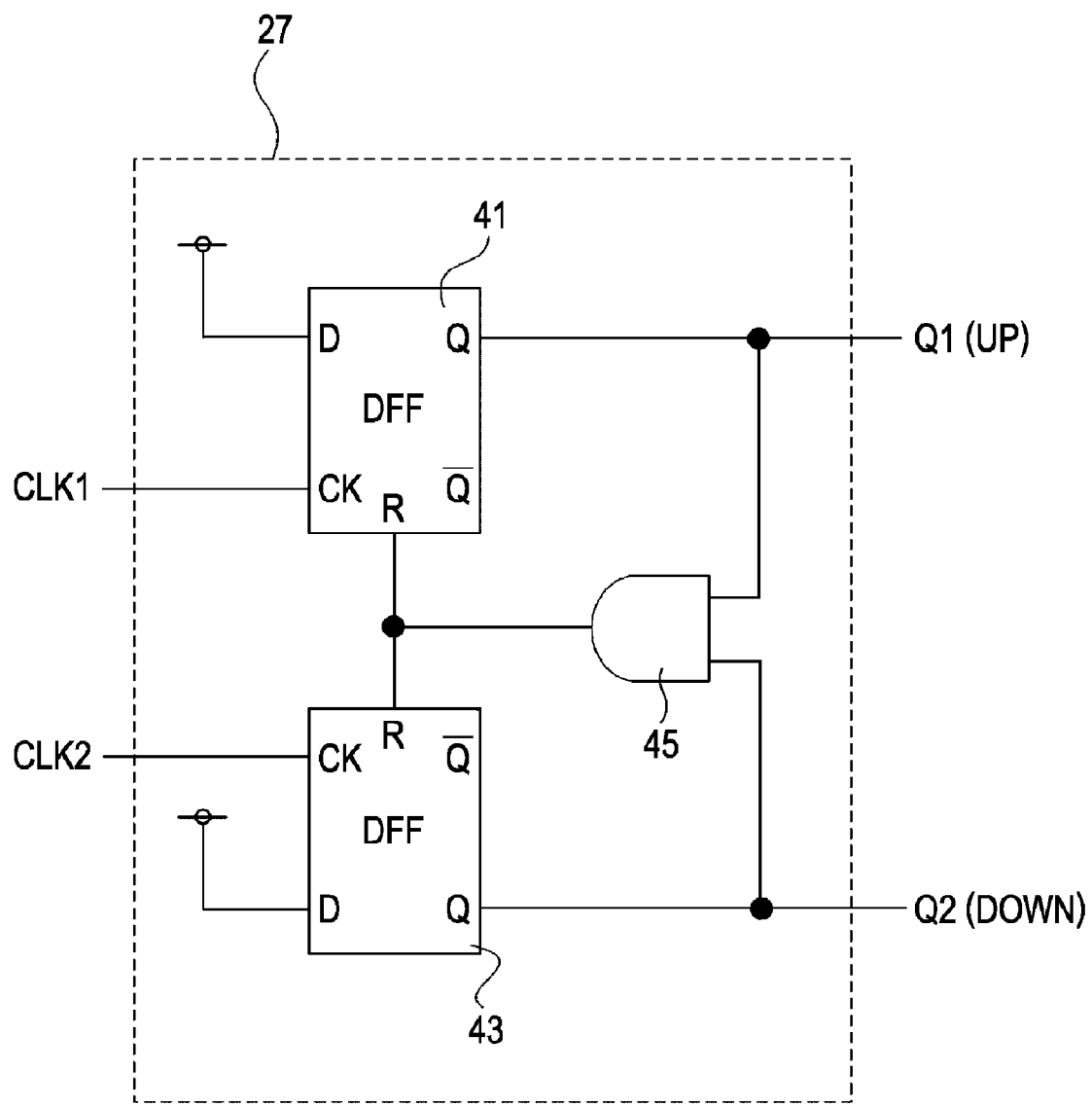
FIG. 4 is a diagram for describing the configuration example of a phase comparison circuit.

FIG. 4 illustrates a circuit configuration example of the phase comparison circuit 27. The phase comparison circuit 27 is configured of a D flip-flop 41 operating with the input clock CLK1 as the clock signal, a D flip-flop 43 operating with the output clock CLK2 as the clock signal, and an AND gate 45 which obtains the logical conjunction of the output signals of the D flip-flops 41 and 43 and generates reset signals for the D flip-flops 41 and 43.

In the case of this circuit configuration, with the phase comparison circuit 27, the output signal of the D flip-flop corresponding to the clock CLK regarding which the rising edge has been detected first goes to "H" level, and the determination outputs Q1 and Q2 of the D flip-flops 41 and 43 are both reset at a timing at which the output signal of the D flip-flop corresponding to the clock CLK regarding which the "H" level appears later goes to "H" level.

Consequently, the determination outputs Q1 and Q2 are output for "H" level for an amount corresponding to the phase difference. For example, in the event that the phase of the input clock CLK1 is advanced as to the output clock CLK2, the determination output Q1 is "H" level of an amount corresponding to the period of the phase difference. On the other hand, in the event that the phase of the input clock CLK2 is advanced as to the output clock CLK1, the determination output Q2 is "H" level of an amount corresponding to the period of the phase difference. Note that in the event that the edge phases of the input clock CLK1 and the output clock CLK2 are about the same, at the phase comparison circuit 27 determination outputs Q1 and Q2 of "L" level continue to be output from the D flip-flops 41 and 43. FIG. 5 illustrates the relation between the above-described determination outputs Q1 and Q2 and phase state.

The shift clock generating unit 29 is a circuit which controls supplying and stopping of a shift clock based on the determination outputs Q1 and Q2 of the phase comparison circuit 29. The functions of this shift clock generating unit 29 corresponding to the delay amount control unit. The shift clock generating unit 29 supplies the ring-type shift register 31 with the shift clock SCLK while one of the determination outputs Q1 and Q2 is "H" level and the other is "L" level, and stops supply of the shift clock SCLK to the ring-type shift register 31 while both of the determination outputs Q1 and Q2 are "L" level.

Figure 6:
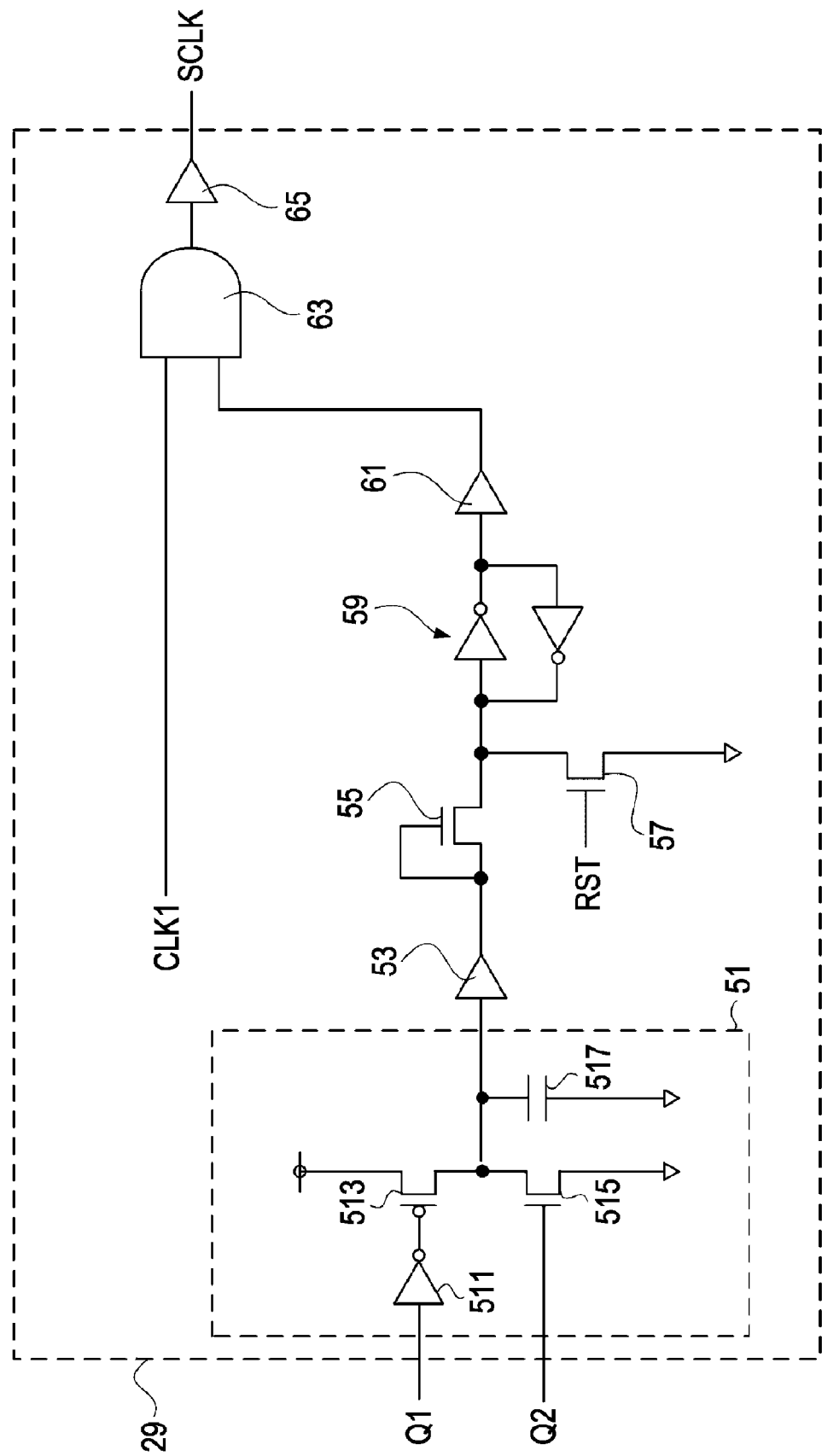
FIG. 6 is a diagram illustrating a configuration example of a shift clock generating unit.

FIG. 6 illustrates a circuit example of the shift clock generating unit 29. In the case shown in FIG. 6, the shift clock generating unit 29 is configured of a charge pump 51, a buffer 53, a diode-connected transistor 55, a reset transistor 57, a latch 59, a buffer 61, an AND gate 63, and a buffer 65.

The charge pump 51 is configured of an inverter 511 for performing logical inversion of the determination output Q1, CMOS switches 513 and 515, and a retaining capacitance 517. In the initial state, the charge pump 51 outputs the "L" level. Note that in the case of the present embodiment, the clock signal generating circuit 11 is designed such that immediately following the reset operation, "L" level is output until the phase of the input clock CLK1 is ahead of than the phase of the output clock CLK2. At the point that the phase of the input clock CLK1 is the same as the phase of the output clock CLK2, or the phase of the input clock CLK1 is ahead of the phase of the output clock CLK2, the charge pump 51 outputs the "H" level.

The buffer 53 is a circuit with an even number of inverter circuits connected serially. The diode-connected transistor 55 functioning as a voltage follower is a buffer circuit with the train electrode and gate electrode of a thin-film transistor connected, with the gate electrode potential being the source electrode potential with no change. The reset transistor 57 is a thin-film transistor for forcibly resetting the input level of the latch 59 to the "L" level.

The latch 59 is a circuit stage wherein two inverter circuits are connected in ring fashion. The buffer 61 is a circuit with an even number of inverter circuits connected serially. The AND gate 63 is a gate circuit for outputting the logical conjunction of the above-described logic gates 51, 53, 55, 95, 59, and 61, and the shift clock SCLK.

Accordingly, the AND gate 63 outputs the shift clock SCLK to the buffer 55 only while the output of the logic gates 51, 53, 55, 95, 59, and 61 is "H" level, and stores output of the shift clock SCLK when the output of the logic gates 51, 53, 55, 95, 59, and 61 is "L" level. Note that the buffer 105 is a circuit with multiple inverter circuits connected serially.

The ring-type shift register 31 is a shift register circuit with D flip-flops of a number equal to the number of digital delay lines 83 connected in ring fashion. This ring-type shift register 31 is a form of the "delay amount setting unit" as mentioned otherwise in the present Specification.

Figure 7:
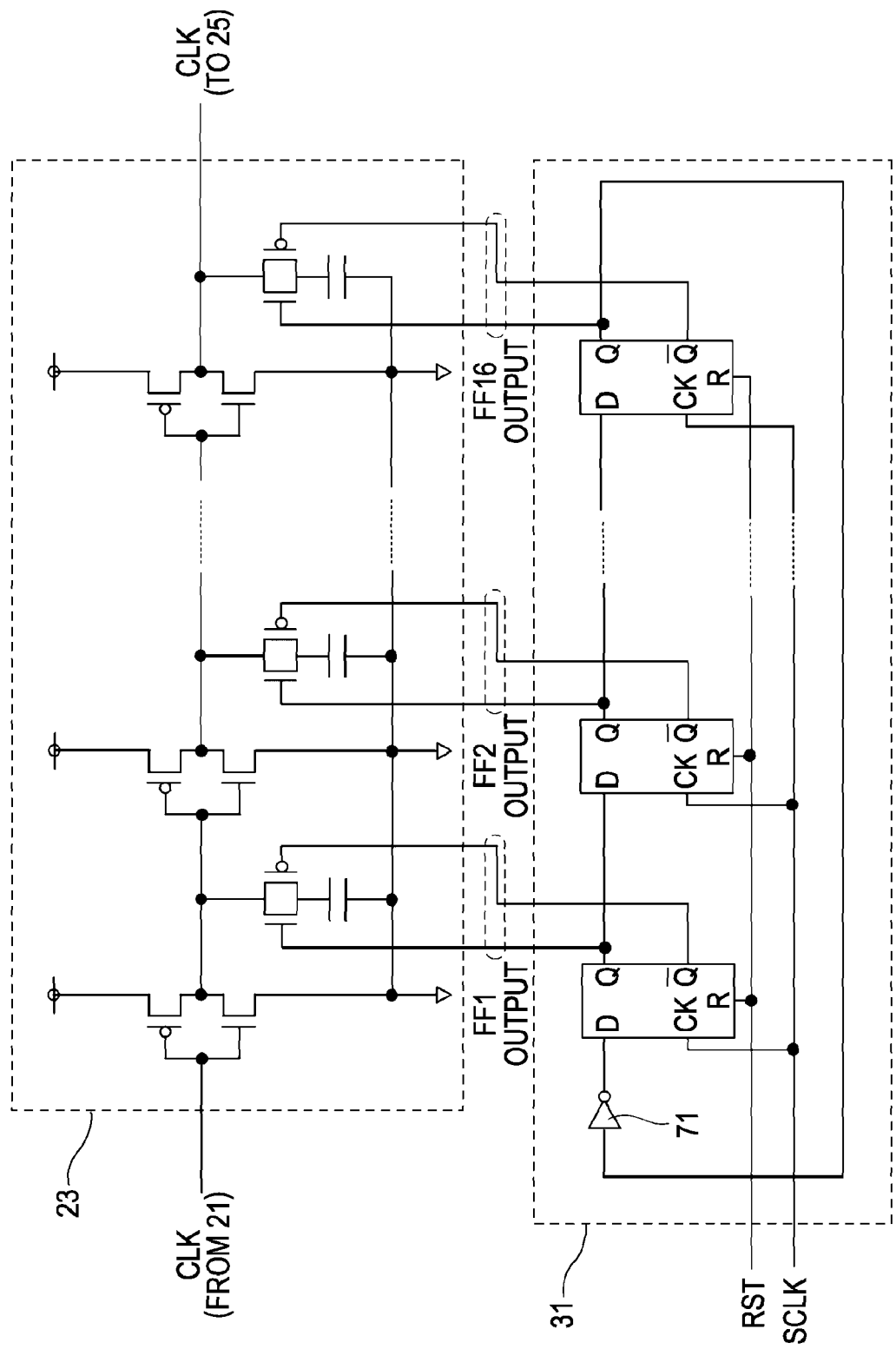
FIG. 7 is a diagram illustrating the connection relation between a ring type shift register and digital delay line.

FIG. 7 illustrates a circuit example of the ring-type shift register 31. In the case illustrated in FIG. 7, the ring-type shift register 31 is configured of 16 D flip-flop circuits wherein the Q output of the previous stage is the D input of the next stage, and an inverter circuit 71 wherein the Q output of the final stage is subjected to logical inversion and fed back to the D input of the first stage.

Note that the D flip-flop circuits have reset terminals, with the Q output of all being changed to an "L" level state by input of a reset signal. Also, the D flip-flop circuits have shift clock terminals to execute operations for latching D input under supply of a shift clock SCLK and output to the next stage as Q output.

In the case of this embodiment, operation is performed such that the number of Q outputs which rise to "H" level is equal to the number of rising edges of the shift clocks SCLK input from the reset state. Of course, the relation of the logical level of the Q output and the inverse output thereof (inverse Q output) is mutually inverse.

Also, the Q output and inverse Q output at each flip-flop circuit stage executes the open/close operation of CMOS switches corresponding to each stage making up the digital delay line 83. Note that the Q output is connected to the gate electrode of the n-channel thin-film transistor, and that the inverse Q output is connected to the gate electrode of the p-channel thin-film transistor. Accordingly, opening operations and closing operations of the two thin-film transistors making up are each performed at the same time.

A-3 Operations and Advantages of the Clock Signal Generating Circuit

Figure 8:
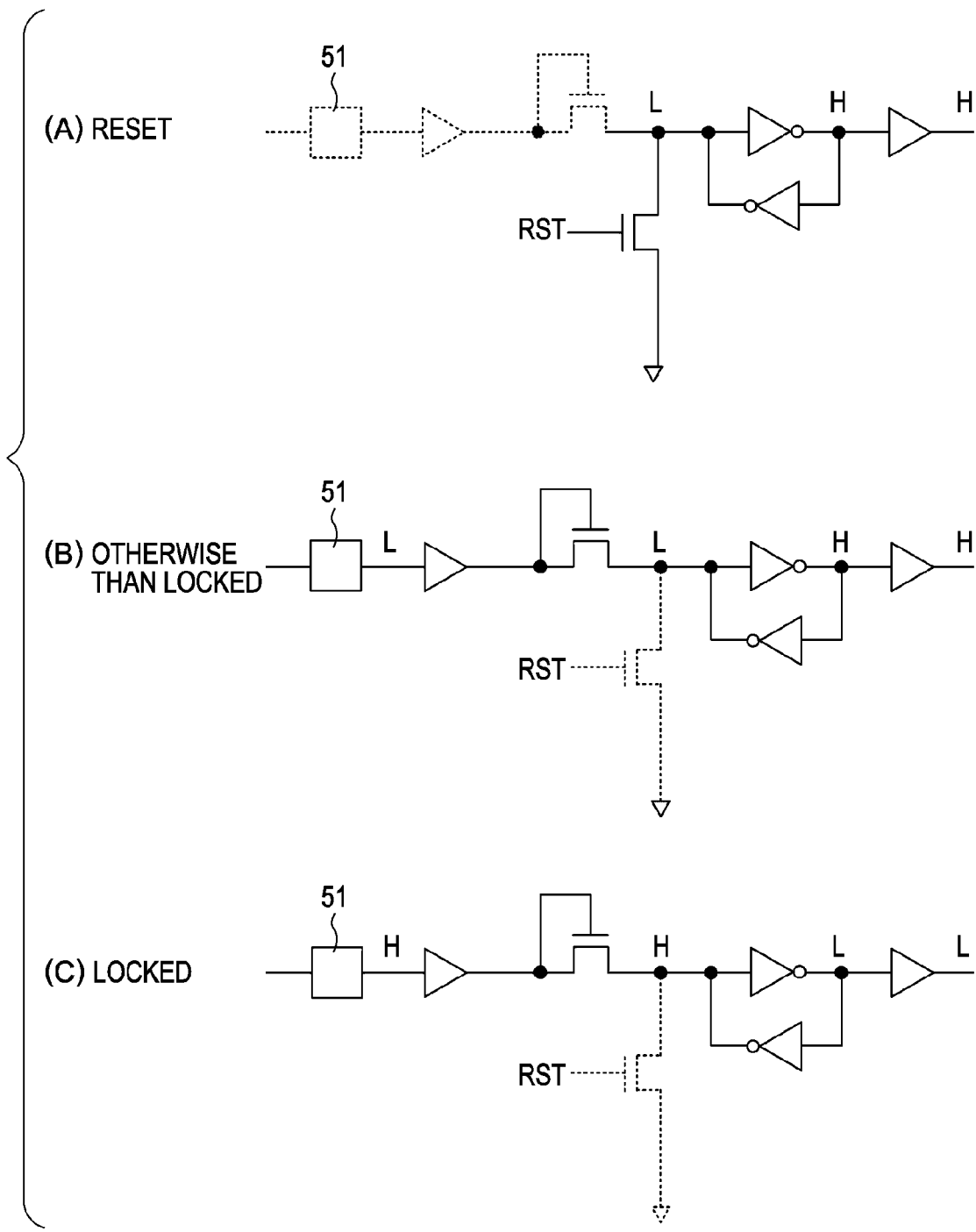
FIG. 8 is a diagram for explaining the operating state of the shift clock generating unit.
Figure 9:
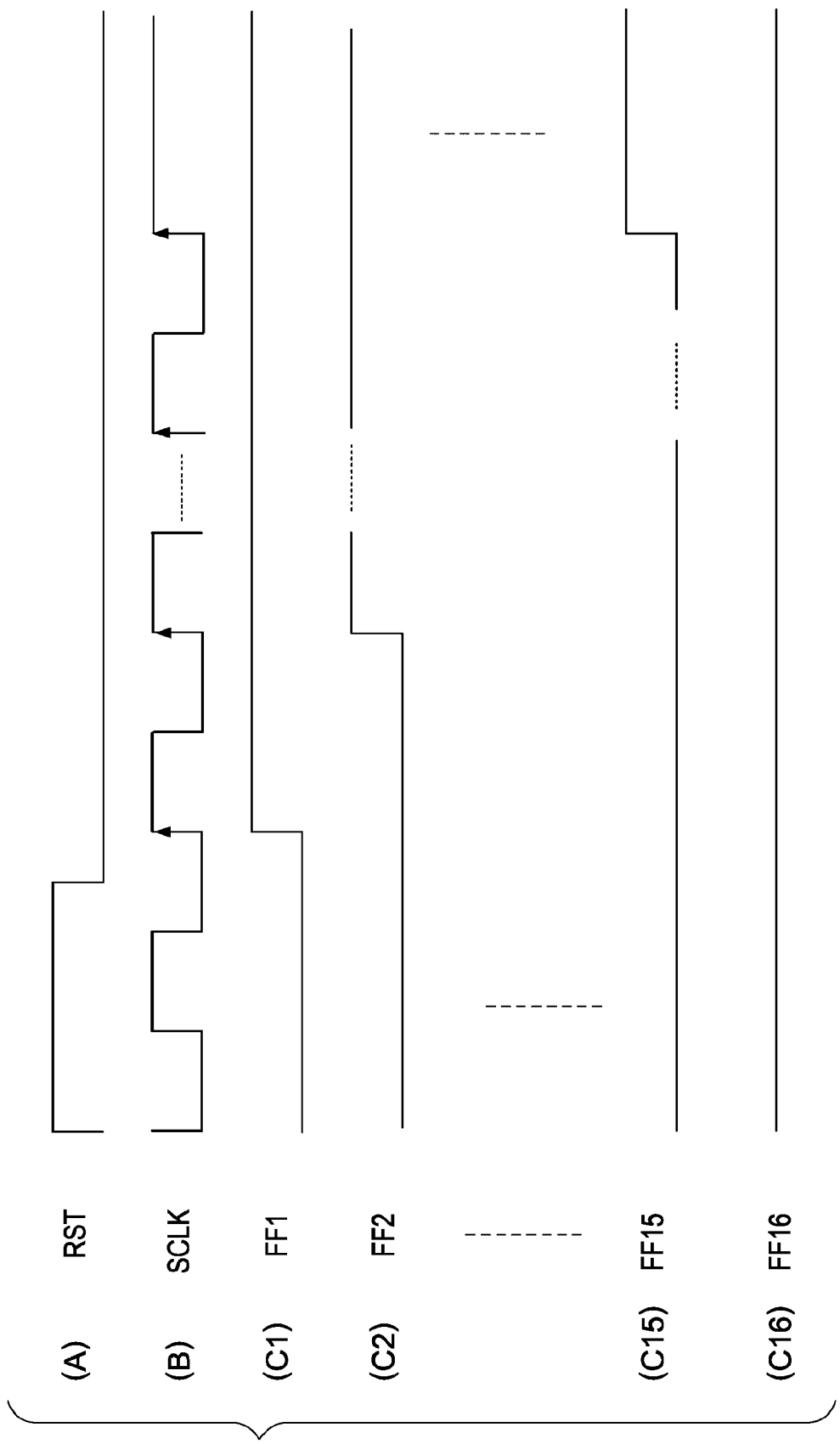
FIG. 9 is a diagram for illustrating operating procedures of the clock signal generating circuit according to the second embodiment.

The following is a description of operations executed at the clock signal generating circuit 11, with reference to FIGS. 8 and 9.

(a) Reset

First, the reset operation executed at the time of turning on the power will be described. (A) in FIG. 8 is a diagram for describing the operational state of the shift clock generating unit 29 at the time of reset operations. At this time, the upstream potential of the latch 59 configuring the shift clock generating unit 29 is forcibly set to the "L" level. Accordingly, logic gate output of "H" level is input to the AND gate 63 configuring the shift clock generating unit 29.

Accordingly, a shift clock SCLK is supplied from the shift clock generating unit 29 to the ring-type shift register 31 ((B) in FIG. 9). Note, however, that the reset signal ((A) in FIG. 8) is "H" level, so each D flip-flop making up the shift clock generating unit 29 is reset. That is to say, even if the shift clock SCLK is input, the Q output of each D flip-flop (Stage (C1) through (C16) in FIG. 9) is "L" level. Accordingly, the delay amount of the digital delay line 23 during the reset period remains the minimum value. The reason is that all CMOS switches of the digital delay line 23 are controlled open.

(b) Up to Phase Lock

Next, the operations from ending of the reset operation up to phase lock of the input clock CLK1 and the output clock CLK2 will be described. (B) in FIG. 8 illustrates the operating state at the point of ending the reset operation. At this time, the input clock CLK1 and the output clock CLK2 are not yet synchronized. Accordingly, the output of the charge pump 51 is "L" level. Of course, the input potential of the latch 59 configuring the shift clock generating unit 29 is "L" level, and the state is maintained. Accordingly, logic gate output of "H" level is input to the AND gate 63 configuring the shift clock generating unit 29.

Thus, the shift clock SCLK continues to be supplied from the shift clock generating unit 29 to the ring-type shift register 31 during this period as well ((B) in FIG. 9). However, in this case, the reset signal ((A) in FIG. 9) is "L" level. Accordingly, each time an edge of a shift clock SCLK is input to the D flip-flop, the Q output rises to the "H" level in order from the head stage.

(C1) through (C15) in FIG. 9 illustrate waveforms in the event that 15 shift clock SCLK edges are input. That is to say, Q output of "H" level is output from the head to the 15th D flip-flop, and only the 16th D flip-flop outputs Q output of "L" level.

(c) After Phase Lock

Finally, operations following phase lock will be described. (C) in FIG. 8 illustrates the operation state of the shift clock generating unit 29 at the time of phase lock. At this time, the input clock CLK1 and the output clock CLK2 are synchronized, so the output of the charge pump changes to "H" level for the first time.

Consequently, the input potential of the latch 59 is set to "H" level, and that state is maintained. This potential change switches the logic gate output input to the AND gate 63 configuring the shift clock generating unit 29 from "H" level to "L" level, and subsequently that state is maintained. As shown in (B) in FIG. 9, from this potential on, supply of the shift clock SCLK to the ring-type shift register 31 is stopped. As a matter of course, upon supply of the shift clock SCLK stopping, the shift operation of the "H" level at the ring-type shift register 31 stops. In the example in FIG. 9, the state wherein the Q output from the head to the 15th stage are switched to "H" level is maintained.

On the other hand, the number of connected load capacitances connected to the CMOS inverter circuit making up the digital delay line 23 is 15, so a clock wherein the delay time thereof has been adjusted so as to be longer than the minimum value of the delay time by 15 increment delay times is output to the output buffer circuit 27.

(d) Summarization

As described above, configuring the delay amount setting unit with the ring-type shift register 31 enables digital control of the delay amount. Moreover, this circuit configuration uses fewer devices as compared to a delay amount setting unit according to the related art which uses a counter and decoder, whereby reduction in circuit scale can be reduced.

Figure 10:
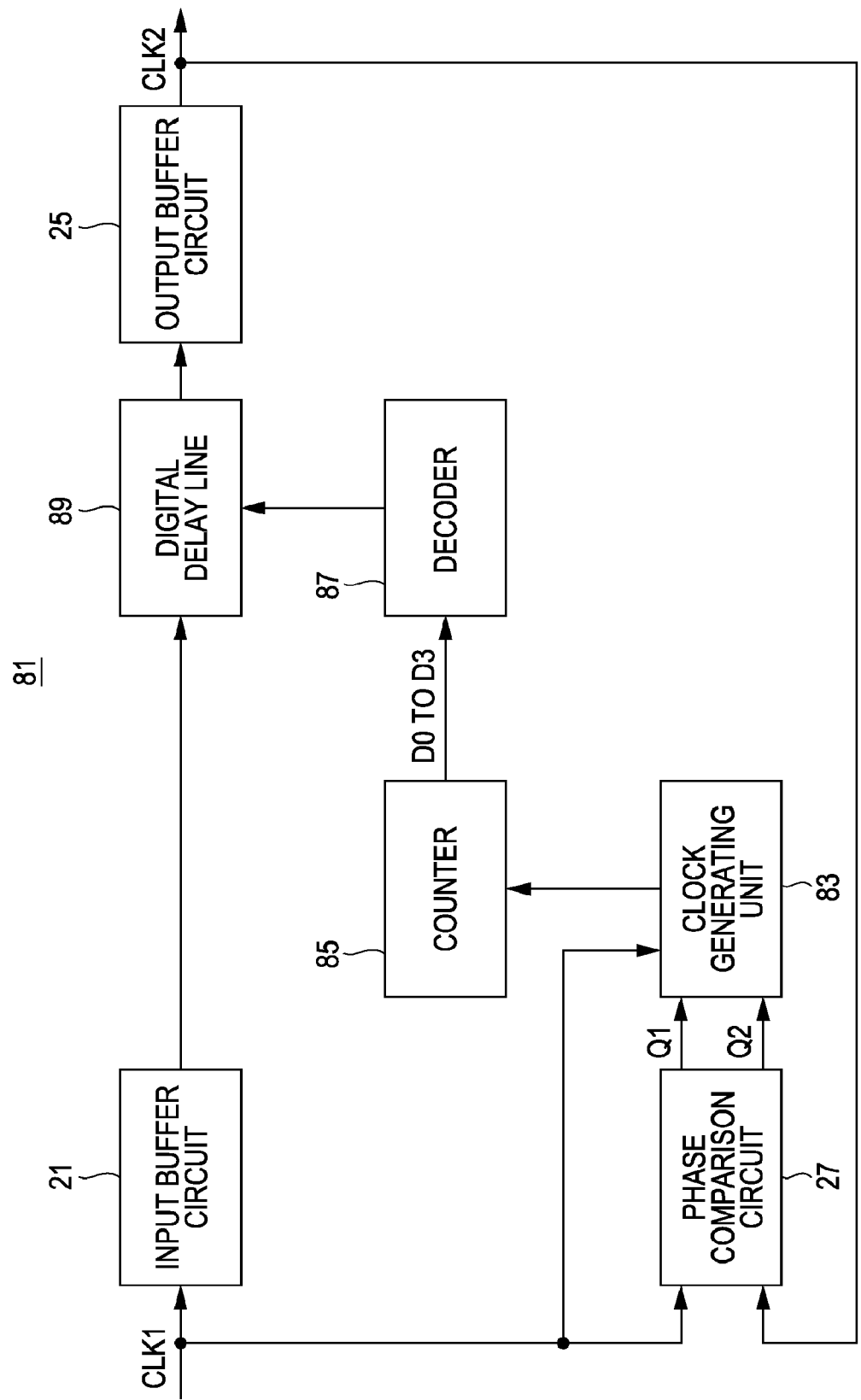
FIG. 10 is a diagram illustrating a configuration example of a clock signal generating circuit according to the related art.

FIG. 10 illustrates an example of a clock signal generating circuit using a delay amount setting unit configured of a counter and decoder. Note that the components in FIG. 10 which correspond to those in FIG. 2 are denoted with the same reference numerals. The clock signal generating circuit 81 is configured of an input buffer circuit 21, output buffer circuit 25, phase comparison circuit 27, clock generating unit 83, counter 85, decoder, and digital delay line 89.

Of these, the input buffer circuit 21, output buffer circuit 25, and phase comparison circuit 27 are the same as those in FIG. 2. Unlike the structure shown in FIG. 6, the digital delay line 89 is configured of a serially connected circuit of 16 buffer circuit stages, each of which have serial connection of two CMOS inverter circuits as a single increment.

Note that each buffer circuit stage (excluding the final stage) has the output line thereof split into two, with one being connected to the next buffer circuit stage, and with the other connected to an output terminal via a CMOS switch. In the case of this circuit configuration, control of the delay amount is realized by control of the position of only one CMOS switch which is controlled closed, out of the 16 CMOS switches.

Figure 11:
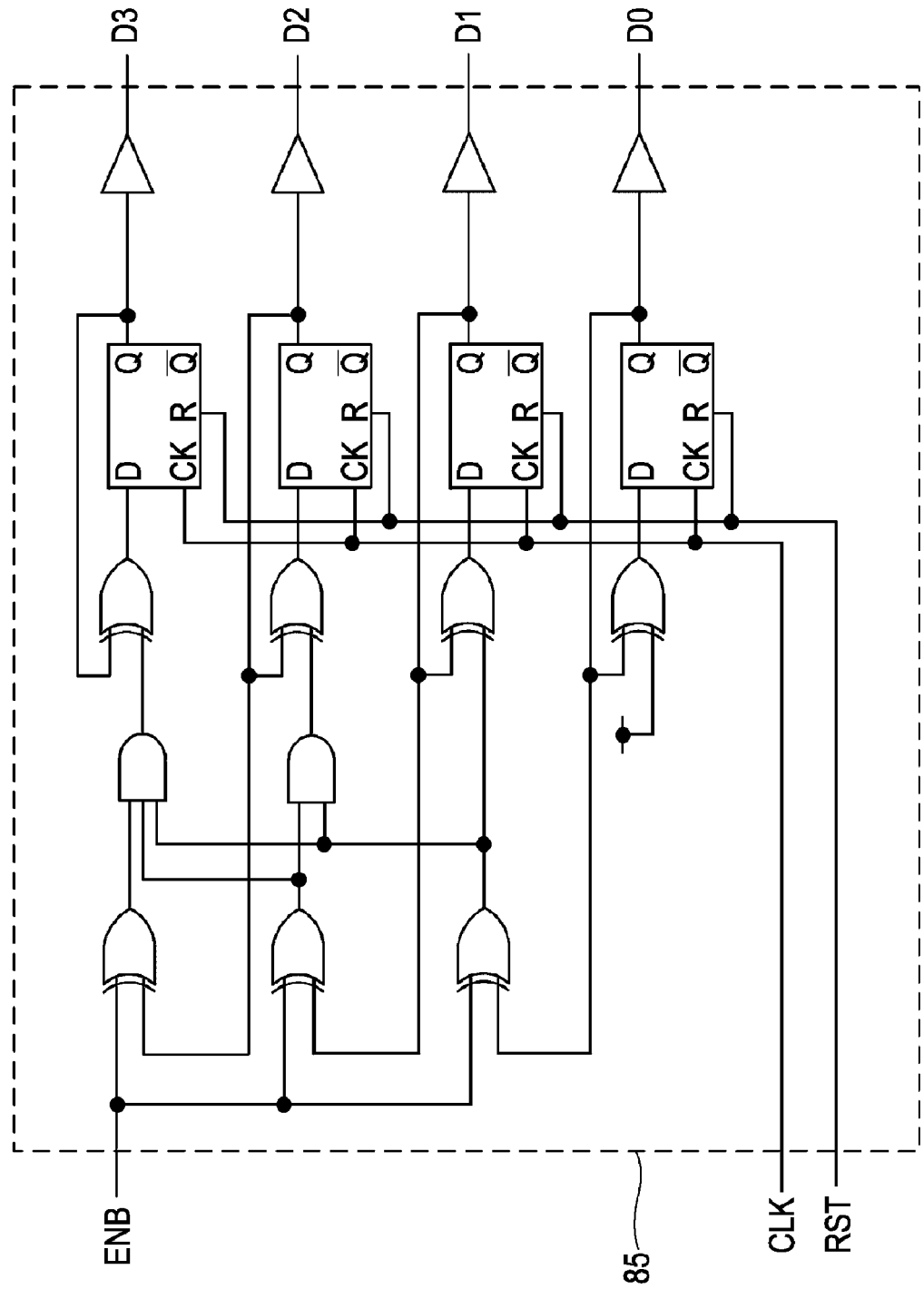
FIG. 11 is a diagram illustrating a configuration example of a counter.
Figure 12:
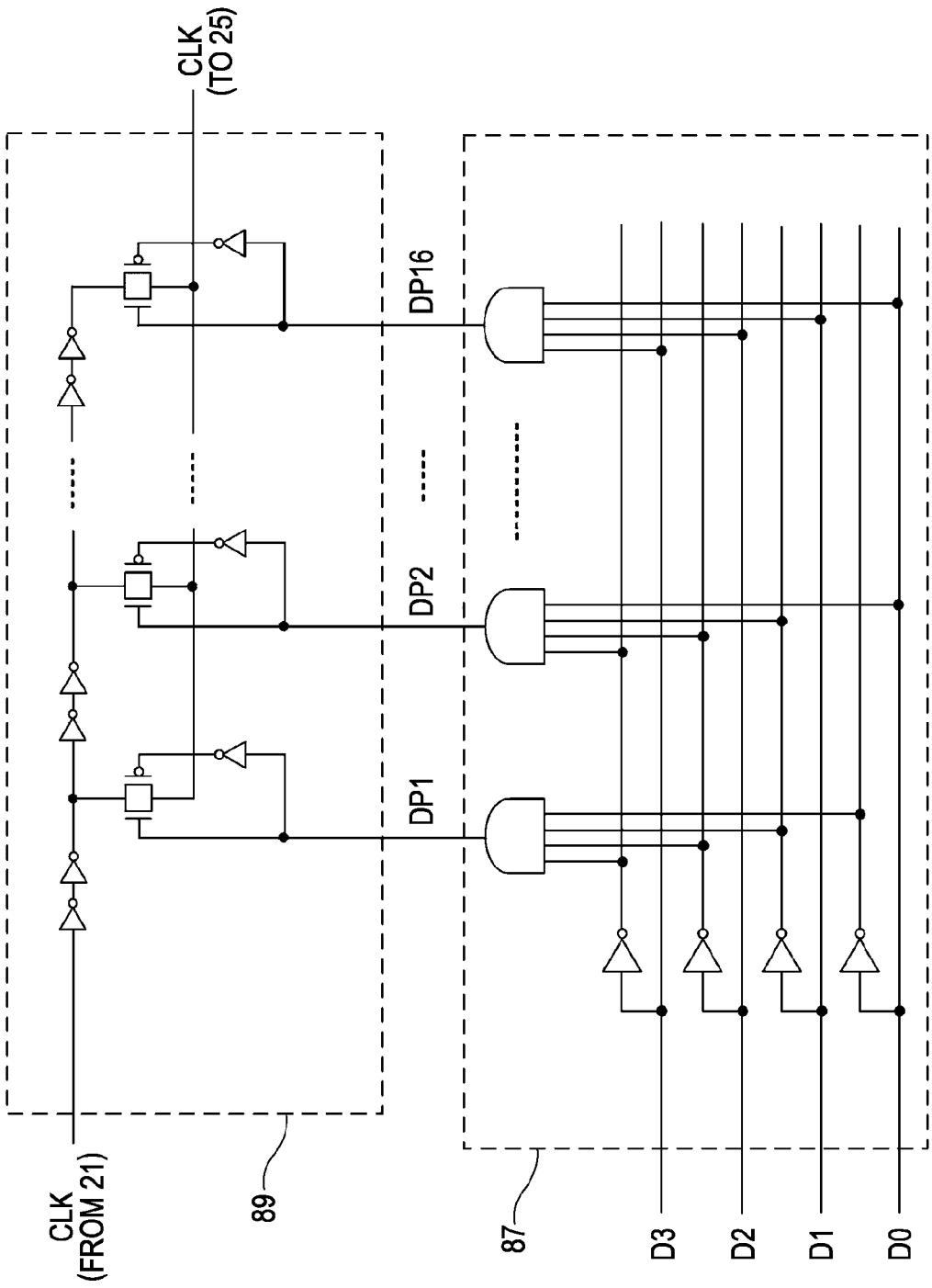
FIG. 12 is a diagram illustrating a configuration example of a decoder.

The decoder 87 generates the position of this one CMOS switch, based on the count value. FIGS. 11 and 12 illustrating a circuit configuration example of the counter 85 and decoder 78 suitable for driving the digital delay line 89.

Now, the number of devices of the counter 85 shown in FIG. 11 is the sum of 80 (20×4) which is four D flip-flops, 70 (10×7) which is seven XOR gates, 8 which is three input AND circuits, 6 which is two input AND circuits, and 16 (4×4) which is four buffer circuits. That is to say, the counter 85 is configured of a total of 180 devices. On the other hand, the number of devices of the decoder 87 shown in FIG. 12 is 160 (10×16) which is 16 4-input AND gates, and 8 (2×4) which is four inverter circuits. That is to say, the decoder 87 is configured of a total of 168 devices. Overall, with the configuration according to the related art shown in FIG. 10, the counter 85 and decoder 87 use a total of 348 (180+168) devices.

On the other hand, the number of devices of the ring-type shift register 31 shown in FIG. 7 is only the sum of 160 (10×16) which is 16 4-input AND gates, and 2 (2×1) which is one inverter circuit. That is to say, the ring-type shift register 31 can be configured with 162 devices, which is less than half the number of devices of 348 which is the number of devices used with the related art.

Accordingly, employing this circuit configuration can realize marked reduction in circuit scale (circuit area). Consequently, theoretical yield can be raised and manufacturing costs reduced. Another advantage with the present embodiment as compared with the related art is that fewer devices means lower electric power consumption.

B Second Embodiment

B-1 Configuration of Display Panel

Figure 13:
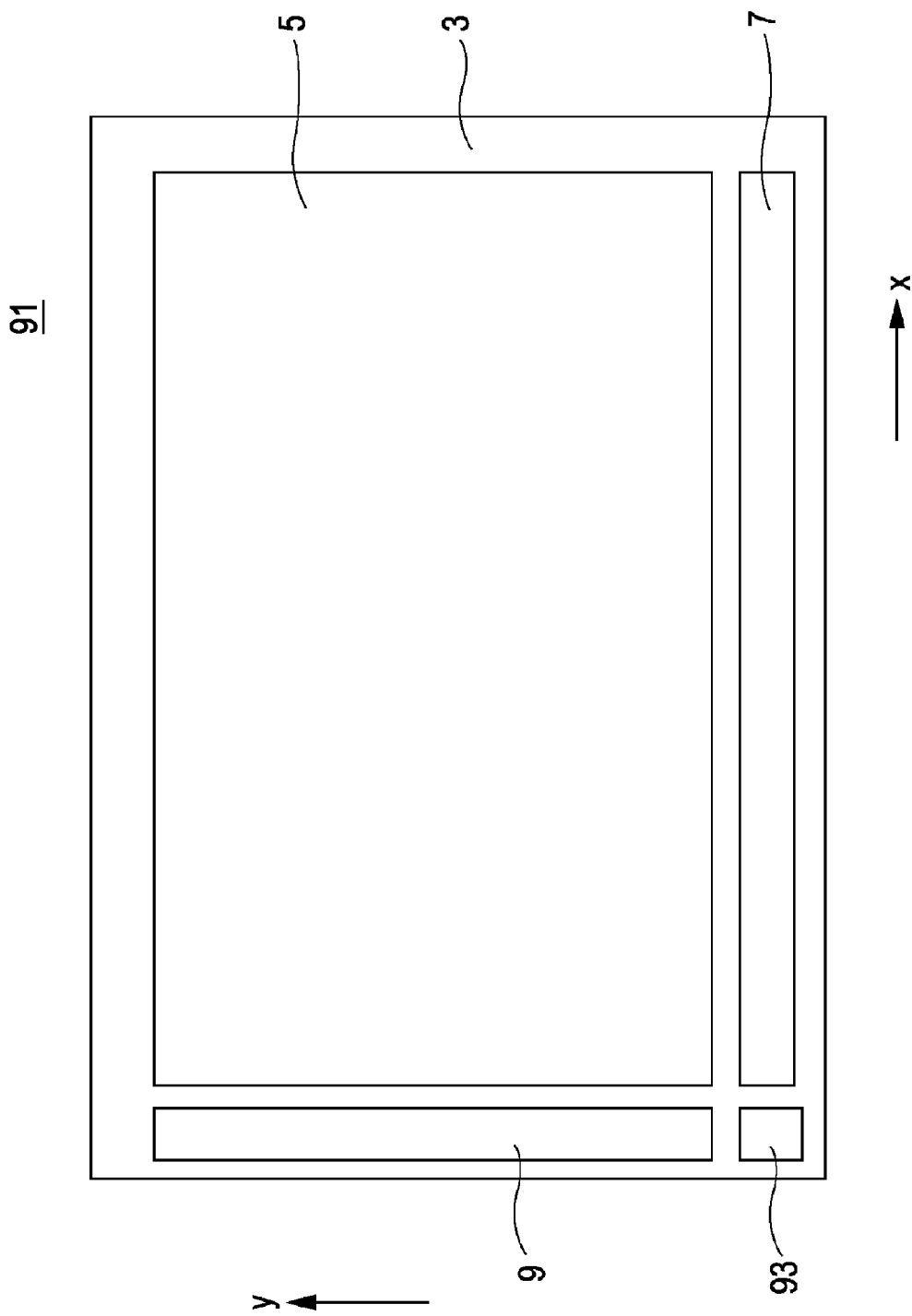
FIG. 13 is a diagram illustrating a plan configuration example of a display panel.

FIG. 13 illustrates a plan view configuration of a display panel 91 to be described in the present embodiment. In FIG. 13, components corresponding to FIG. 1 are denoted with the same reference numerals. As shown in FIG. 13, the display panel 91 differs from the display panel 1 shown in FIG. 1 only regarding the configuration of the clock signal generating circuit 93.

B-2 Configuration of Clock Signal Generating Circuit

Figure 14:
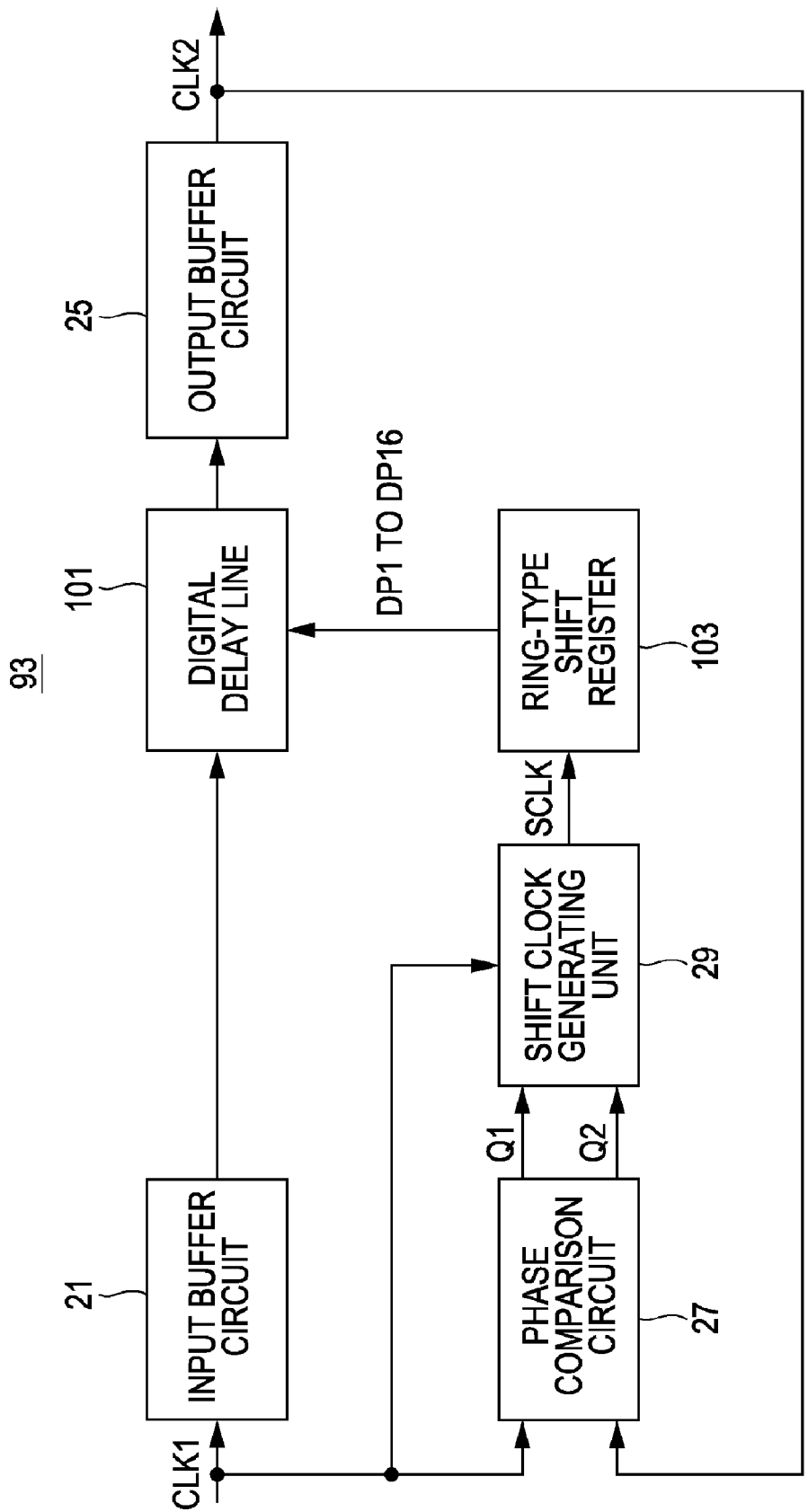
FIG. 14 is a diagram illustrating a configuration example of a clock signal generating circuit according to a second embodiment.

FIG. 14 illustrates an internal configuration example of a delay synchronization loop type clock signal generating circuit 93, proposed by the present Inventors in the present Specification. Components in FIG. 14 which are the same as those in FIG. 2 are denoted with the same reference numerals.

The clock signal generating circuit 93 in FIG. 14 includes an input buffer circuit 21, a voltage control type delay line 23, a digital delay line 101, an output buffer circuit 25, a phase comparison circuit 27, a shift lock generating unit 29, and a ring-type shift register 103. That is to say, the circuit configuration is the same as that of the first embodiment except for the digital delay line 101 and ring-type shift register 103.

The following is a description of the circuit configuration of the digital delay line 101 and ring-type shift register 103 which is a configuration unique to the second embodiment. As with the case of the first embodiment, the digital delay line 101 is a delay line capable of digitally controlling the delay amount of the input clock CLK1. Here, a digital delay line 101 capable of switching the delay amount in a binary manner with a method different from that of the first embodiment will be described.

Figure 15:
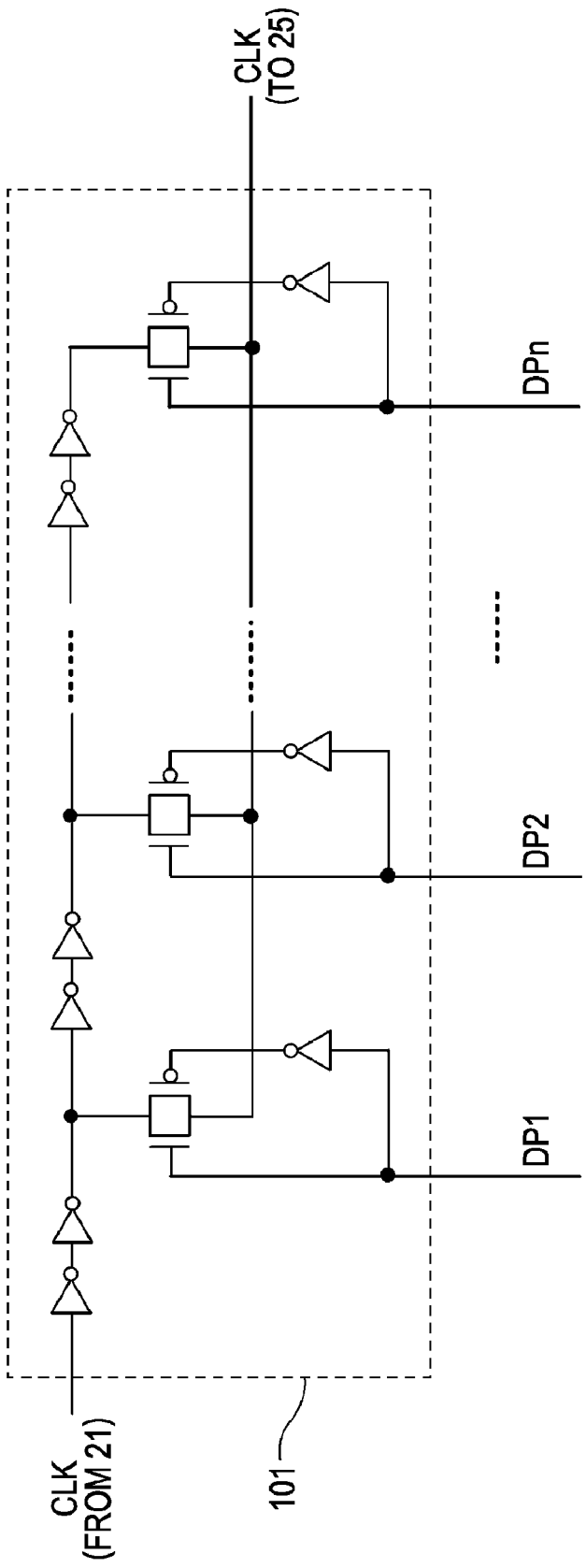
FIG. 15 is a diagram illustrating a configuration example of a digital delay line.

FIG. 15 shows a configuration example of the digital delay line 101. The digital delay line 101 shown in FIG. 15 is configured of a serially connected circuit of 16 buffer circuit stages, each of which have serial connection of two CMOS inverter circuits as a single increment.

Note that each buffer circuit stage (excluding the final stage) has the output line thereof split into two, with one being connected to the next buffer circuit stage, and with the other connected to an output terminal via a CMOS switch. In the case of this circuit configuration, control of the delay amount is realized by control of the position of only one CMOS switch which is controlled closed, out of the 16 CMOS switches.

Accordingly, with a later-described ring-type shift register 103, a decoder 107 is built which generates a delay amount setting signal DP at "H" level for only one stage of the Q outputs output from the 16 D flip-flops 105. In the case of this embodiment, the delay amount of the input clock CLK1 (i.e., the number of buffer circuits which the input clock CLK1 passes through) is set within the range of 1 through 16. Accordingly, a case wherein the CMOS switch situated at the head is controlled closed is the state with the shortest delay time. The arrangement is such that each stage the CMOS switch controlled closed goes toward the back, the greater the delay amount on the digital delay line 101 becomes, in the delay amount increments. Accordingly, in the event that the trailing (16th) CMOS switch is controlled closed, the delay time is maximum.

Figure 16:
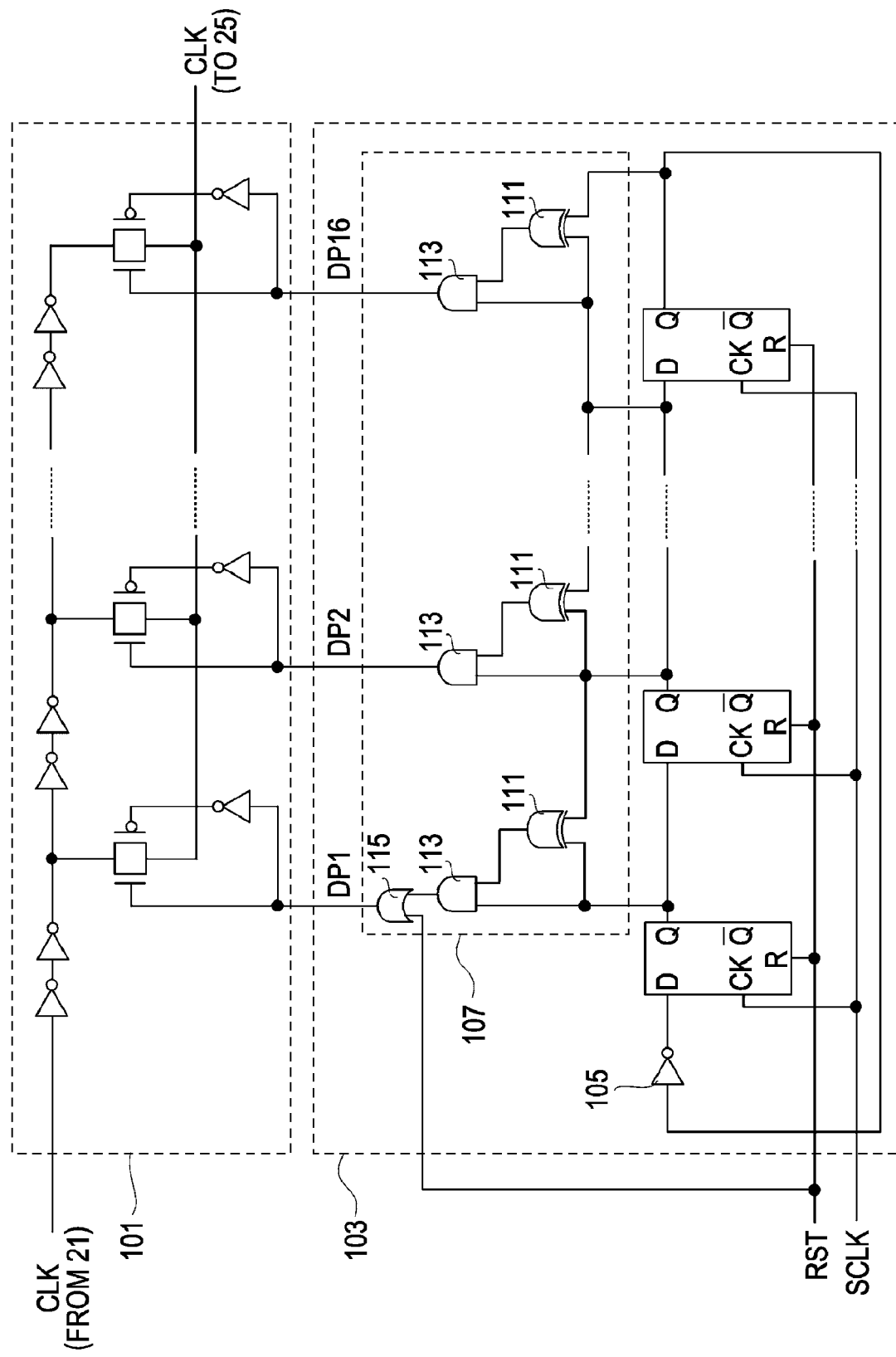
FIG. 16 is a diagram illustrating the connection relation between a ring type shift register and digital delay line.

Next, the configuration of the ring-type shift register 103 will be described. The ring-type shift register 103 is a shift register circuit wherein D flip-flops of a number the same as the stages of the digital delay line 133 have been connected in ring fashion. FIG. 16 illustrates a circuit example of the ring-type shift register 103. In the case shown in FIG. 16, the ring-type shift register 103 is configured of 16 stages of D flip-flop circuits wherein the Q output of the previous stage is the D input of the next stage, and an inverter circuit 105 wherein the Q output of the final stage is subjected to logical inversion and fed back to the D input of the first stage, and a decoder 107.

Note that the D flip-flop circuits have reset terminals, with the Q output of all being changed to an "L" level state by input of a reset signal. Also, the D flip-flop circuits have shift clock terminals to execute operations for latching D input under supply of a shift clock SCLK and output to the next stage as Q output.

The configuration of the shift register is the same as that in the first embodiment. Accordingly, operation is performed such that the number of Q outputs which rise to "H" level is equal to the number of rising edges of the shift clocks SCLK input from the reset state.

However, the digital delay line 101 will not operate correctly if these Q outputs are simply provided to the digital delay line 101 as they are. Accordingly, the decoder 107 comes into play. The decoder 107 basically performs operations for detecting the boundary position of the D flip-flop where the Q output of the "H" level is manifested. That is because this position reflects the delay time used for phase synchronization.

Accordingly, the decoder is configured of 15 XOR circuits 111 for detecting matching/non-matching of the input levels and output levels of the D flip-flops. Using these XOR circuits 111 enables the position of the D flip-flop where its own Q output is "H" level but the Q output of the next stage is "L" level, i.e., the boundary position of level change.

Note that two "H" level pulse signals (delay amount setting signals DP) are manifested in the output of the XOR circuit 111 at the level change boundary position. Accordingly, the AND gate 155 obtains the logical conjunction of the Q output its own stage and the XOR circuit 111, and only one "H" level pulse signal is extracted. The output pulses of the 15 AND gates 113 are supplied to the CMOS switches (more specifically, the gate electrodes thereof) at the corresponding positions in the digital delay line 101, as control signals DP.

Note that a delay amount setting signal DP is of positive logic. Accordingly, an output pulse DP is directly provided to the gate electrode of the n-channel thin-film transistor, and a signal where the output pulse DP has been subjected to logic inversion at the inverter circuit is provided to the gate electrode of the p-channel thin-film transistor.

However, with regard to the output pulse of just the AND gate 113 at the first stage, the output pulse is input to an OR gate 115 along with the reset signal, and the logical sum is supplied to the CMOS switch of the first stage as a delay amount setting signal DP1. Accordingly, the CMOS switch of the first stage can be forcibly close controlled at the time of input of a reset signal.

B-3 Operations and Advantages of the Clock Signal

Figure 17:
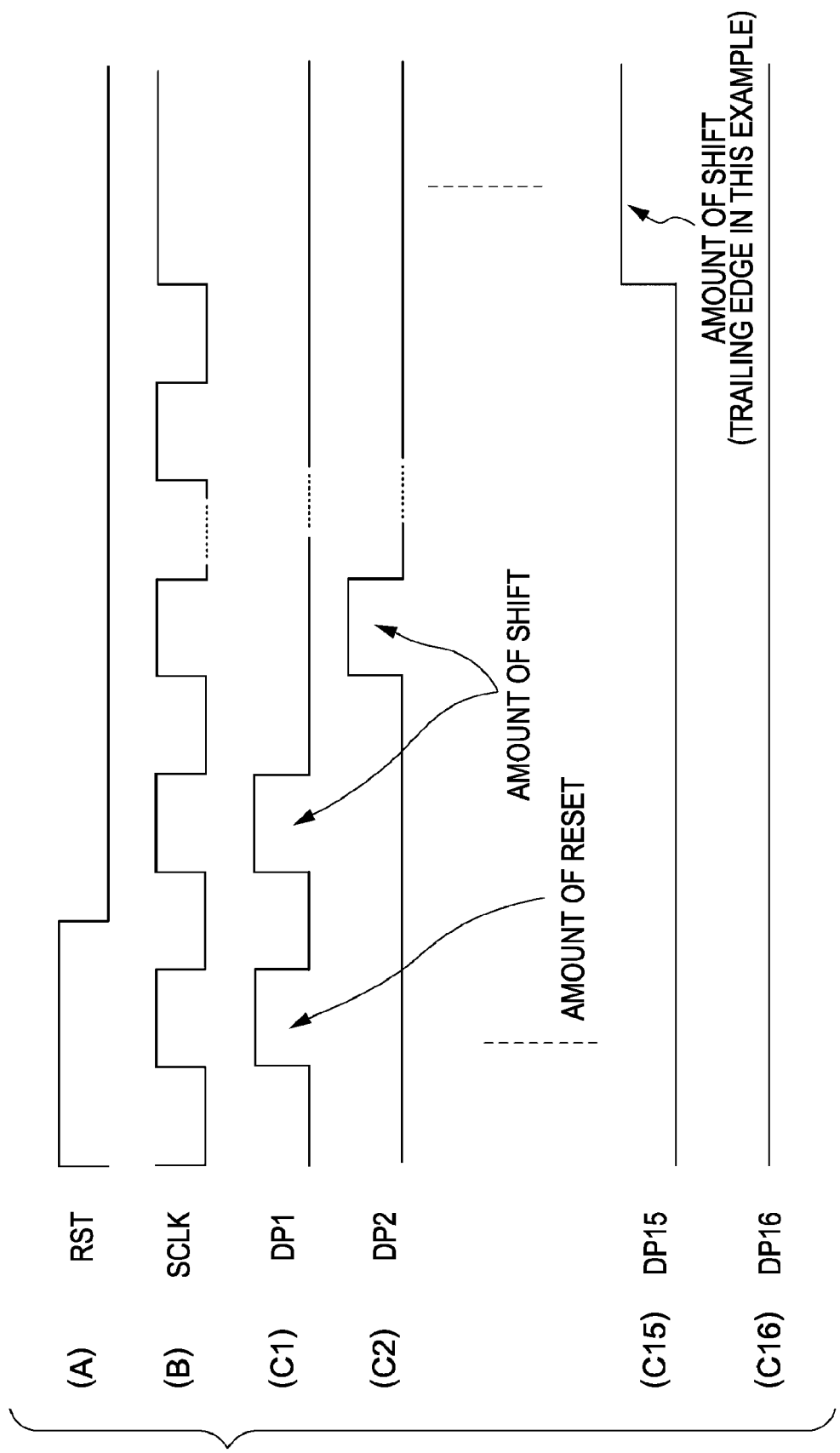
FIG. 17 is a diagram for illustrating an operating example of the clock signal generating circuit according to the second embodiment.

The following is a description of operations executed at the clock signal generating circuit 11, with reference to FIG. 17. Note that the operations of the shift clock generating unit 29 are the same as described above, so description thereof will be omitted.

(a) Reset

First, the reset operation executed at the time of turning the power on will be described. At this time, the ring-type shift register 103 is supplied with an "H" level reset signal ((A) in FIG. 17) and a shift clock SCLK ((B) in FIG. 17). Due to the reset signal which has passed through the OR gate 115, only the first CMOS switch is controlled to a closed state. Accordingly, the delay amount of the digital delay line 101 is controlled to the minimum value.

(b) Up to Phase Lock

Next, the operations from the end of the reset operation to phase lock of the input clock CLK1 and the output clock CLK2 will be described. First, only the Q output of the first stage D flip-flop changes to the "H" level due to input of the first shift clock SCLK following ending of the reset operation. At this time, the Q output of the second stage D flip-flop is "L" level, so the "H" level delay amount setting signal DP is manifested only at the output stage of the first AND gate 113. Accordingly, only the first stage CMOS switch is controlled closed.

Next, upon the second shift clock SCLK following ending of the reset operation being input, the output of the first stage D flip-flop and second stage D flip-flop are at the "H" level. Accordingly, the boundary position of the "H" level Q outputs and "L" level Q outputs is found to be between the second stage D flip-flop and third stage D flip-flop.

Accordingly, the "H" level delay amount setting signal DP is manifested only at the output stage of the second AND gate 113, and only the second stage CMOS switch is controlled closed. Subsequently, each time the shift clock SCLK is input, the position of the CMOS switch controlled closed is shifted in order to the third, fourth, and so on (((C1) through (C14) in FIG. 17).

(c) After Phase Lock

Finally, operations following phase lock will be described. FIG. 17 shows a case wherein the phase lock has been detected at the point that the 15th shift clock SCLK after ending resetting has been input to the ring-type shift register 103. In this case, the boundary position of the "H" level Q outputs and "L" level Q outputs is fixed between the 15th stage D flip-flop and 16th stage D flip-flop. Consequently, the clock delayed at the 15th stage buffer circuit is output to the phase inversion/non-inversion unit 25 through the 15th CMOS switch.

(d) Summarization

As described above, configuring the delay amount setting unit with the ring-type shift register 31 enables digital control of the delay amount. Now, the number of devices of this circuit configuration (FIG. 16) is the sum of 136 (8×17) which is 17 D flip-flops, 96 (10×16) which is 16 XOR gates, 96 which is 16 2-input AND circuits, 6 which is one OR gate, and 34 (2×17) which is 17 inverter circuits. That is to say, this is configured of a total of 432 devices. On the other hand, the number of devices of the delay amount setting unit according to the related art described above is 348. Accordingly, with this embodiment, the number of devices is greater for the embodiment that the related art.

However, with the case of the delay amount setting unit according to the related art, buffers are used for driving the load capacitance of the decoder 87. Also, the greater the number of stages of digital delay lines is, the greater the ratio of increase of devices making up the decoding 87 is, and ultimately the circuit area of the configuration according to the related art is greater.

Note that the reason why the number of devices increases for the related art is that with the case of the decoder 87 of the configuration shown in FIG. 12, the output impedance is high due to the increased number of inputs of OR gates, and delay time of output signals increases. This necessitates dividing of circuits, leading to increase in the number of devices. Also, thin-film transistors and the like have low mobility as compared with crystalline silicon, i.e., the on resistance of the transistors is high, necessitating workarounds to lower impedance.

As described above, employing the configuration described with this embodiment enables the circuit scale (circuit area) to be reduced. Consequently, theoretical yield can be raised and manufacturing costs lowered. Also note that using SR flip-flops instead of D flip-flops enables the number of logical circuits to be reduced, and circuit scale to be reduced.

C Third Embodiment

Figure 18:
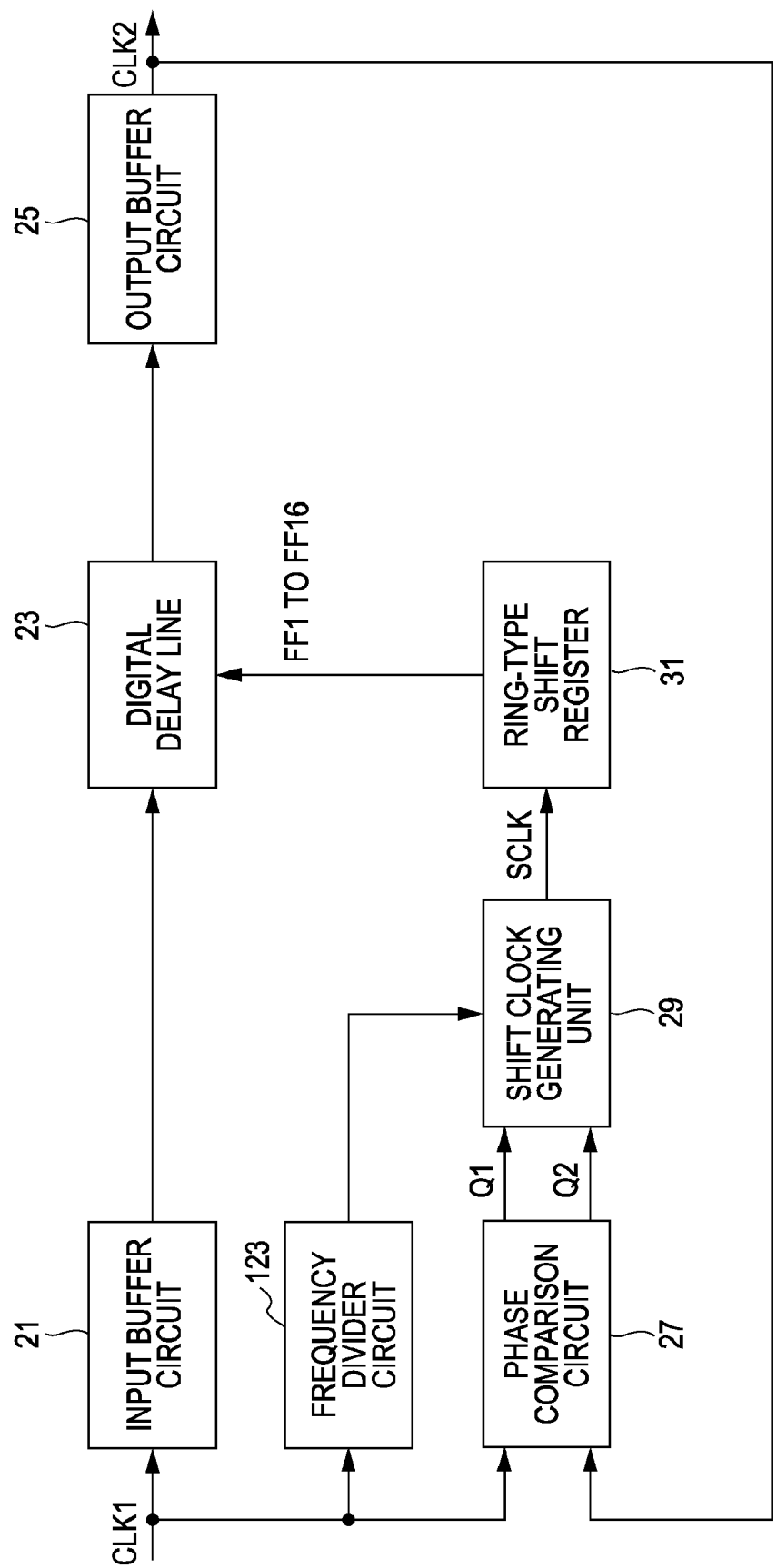
FIG. 18 is a diagram illustrating a configuration example of a clock signal generating circuit according to a third embodiment (part 1)
Figure 19:
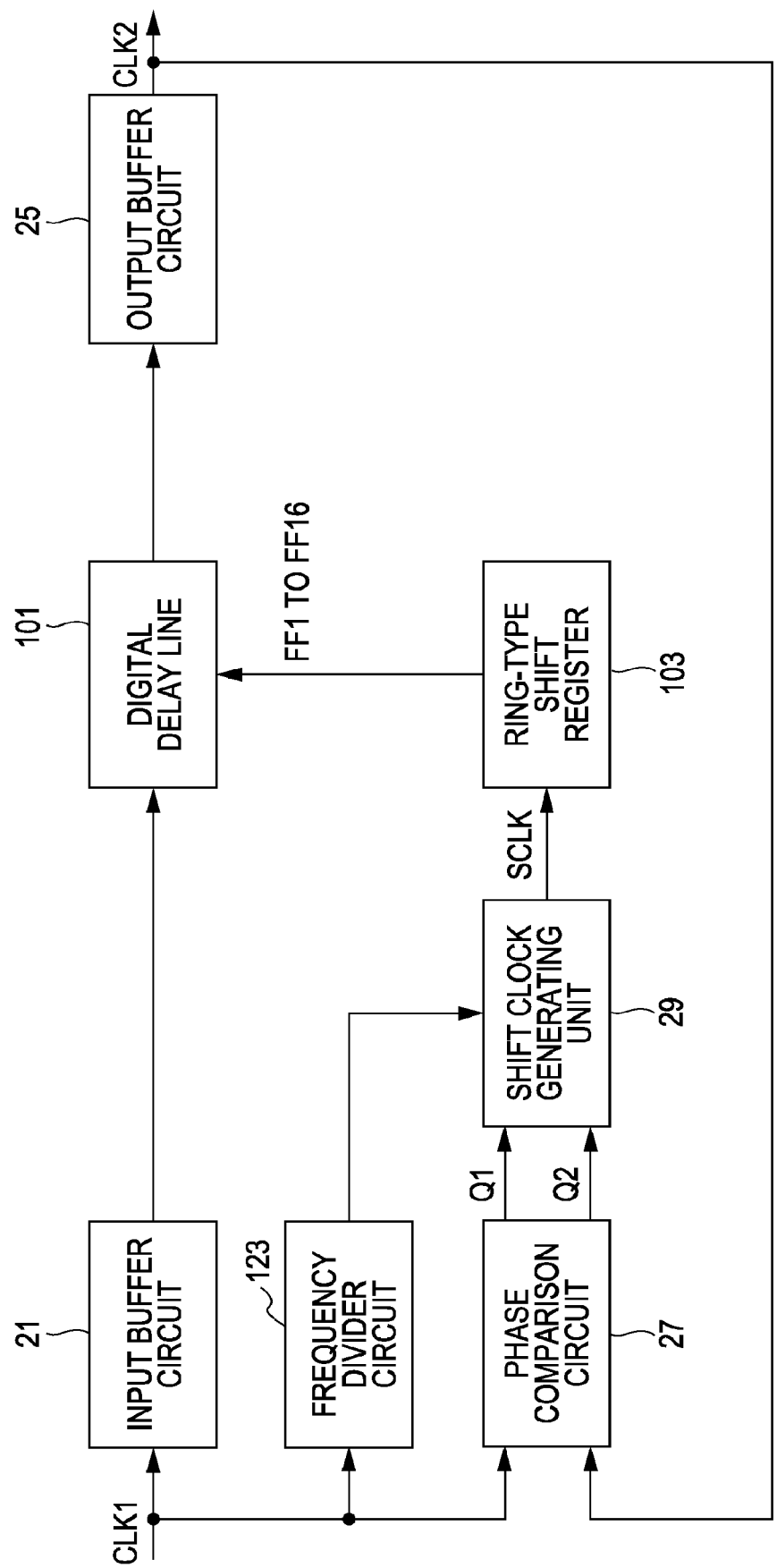
FIG. 19 is a diagram illustrating a configuration example of a clock signal generating circuit according to the third embodiment (part 2)

With this embodiment, a case of frequency division of the input clock CLK1 being used as a shift clock will be described. FIGS. 18 and 19 show a configuration example of clock signal generating circuits with frequency dividing circuits included. FIG. 18 is an example of a clock signal generating circuit 121 where a frequency divider circuit 123 has been added to the first embodiment, and FIG. 19 is an example of a clock signal generating circuit 131 where the frequency divider circuit 123 has been added to the second embodiment.

Note that frequency division by the frequency divider circuit 123 is optional. In either case, the frequency of the shift clock SCLK can be made lower than the input clock CLK1, so operating margin can be ensured for the ring-type shift registers 31 and 103 by just that much. Consequently, influence on yield can be reduced.

D Fourth Embodiment

With this embodiment, a configuration of a clock signal generating circuit which can execute adjustment of delay amount hierarchically will be described. Description of this hierarchical structure will be made regarding the case of two steps of coarse adjustment and fine adjustment.

(a) Configuration of Clock Signal Generating Circuit

Figure 20:
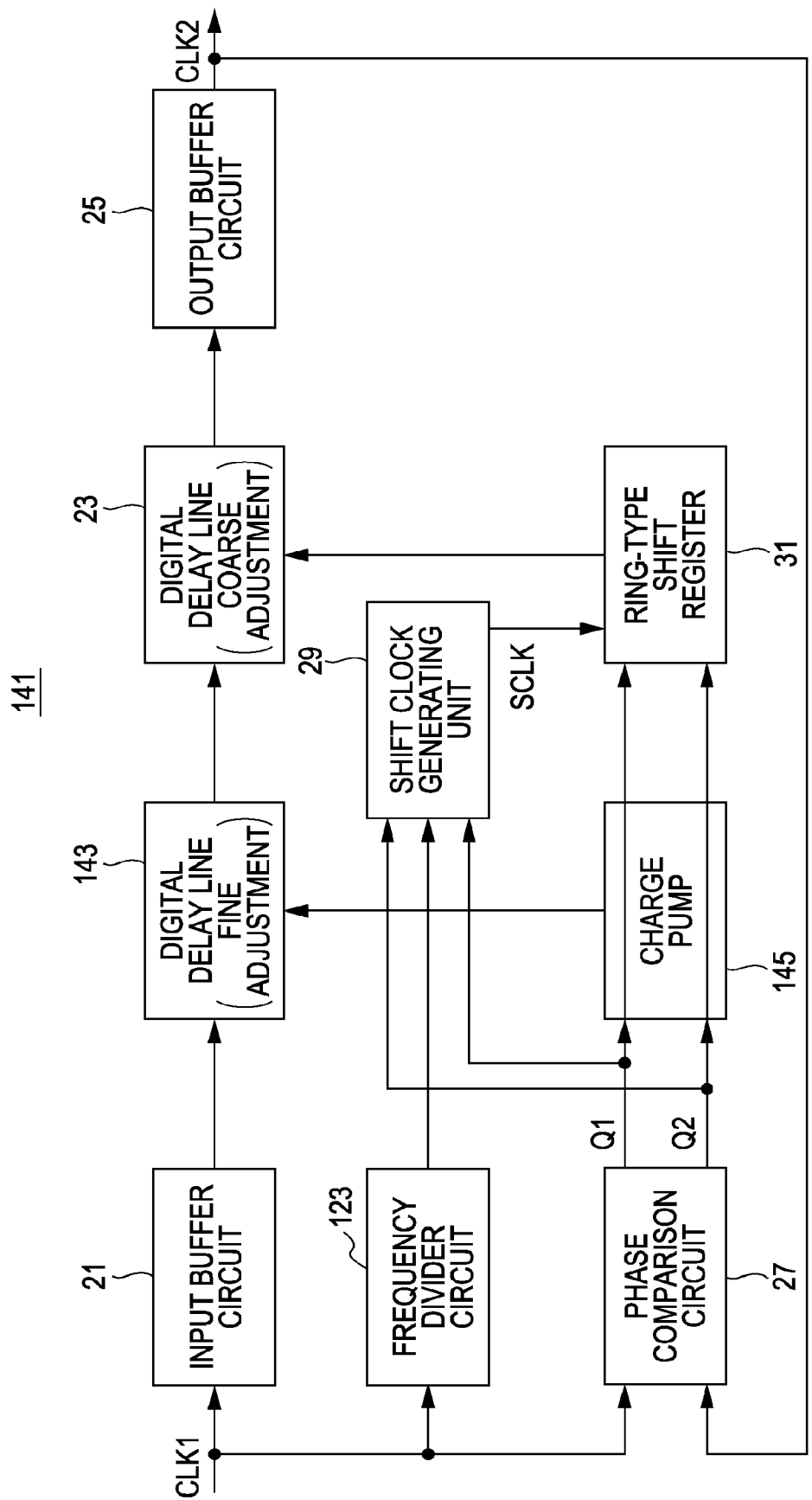
FIG. 20 is a diagram illustrating a configuration example of the clock signal generating circuit according to a fourth embodiment.

FIG. 20 illustrates an internal configuration example of a delay synchronization loop type clock signal generating circuit 141 proposed by the Inventors in the present Specification. Note that components in FIG. 20 which correspond to those in FIG. 18 are denoted with the same reference numerals. Also, while FIG. 20 shows an application to the case of the first embodiment, it is clear that this can be applied to the second embodiment as well.

The clock signal generating circuit shown in FIG. 20 is configured of the input buffer circuit 21, digital delay lines 23 and 143, output buffer circuit 25, phase comparison circuit 27, shift lock generating circuit 29, ring-type shift register 31, frequency divider circuit 123, and charge pump 145.

What is new with this configuration is that the digital delay line is divided into the two stages of the fine adjustment digital delay line 143 and coarse adjustment digital delay line 23, and that the charge pump 145 and ring-type shift register 31 are used respectively for driving these.

Figure 21:
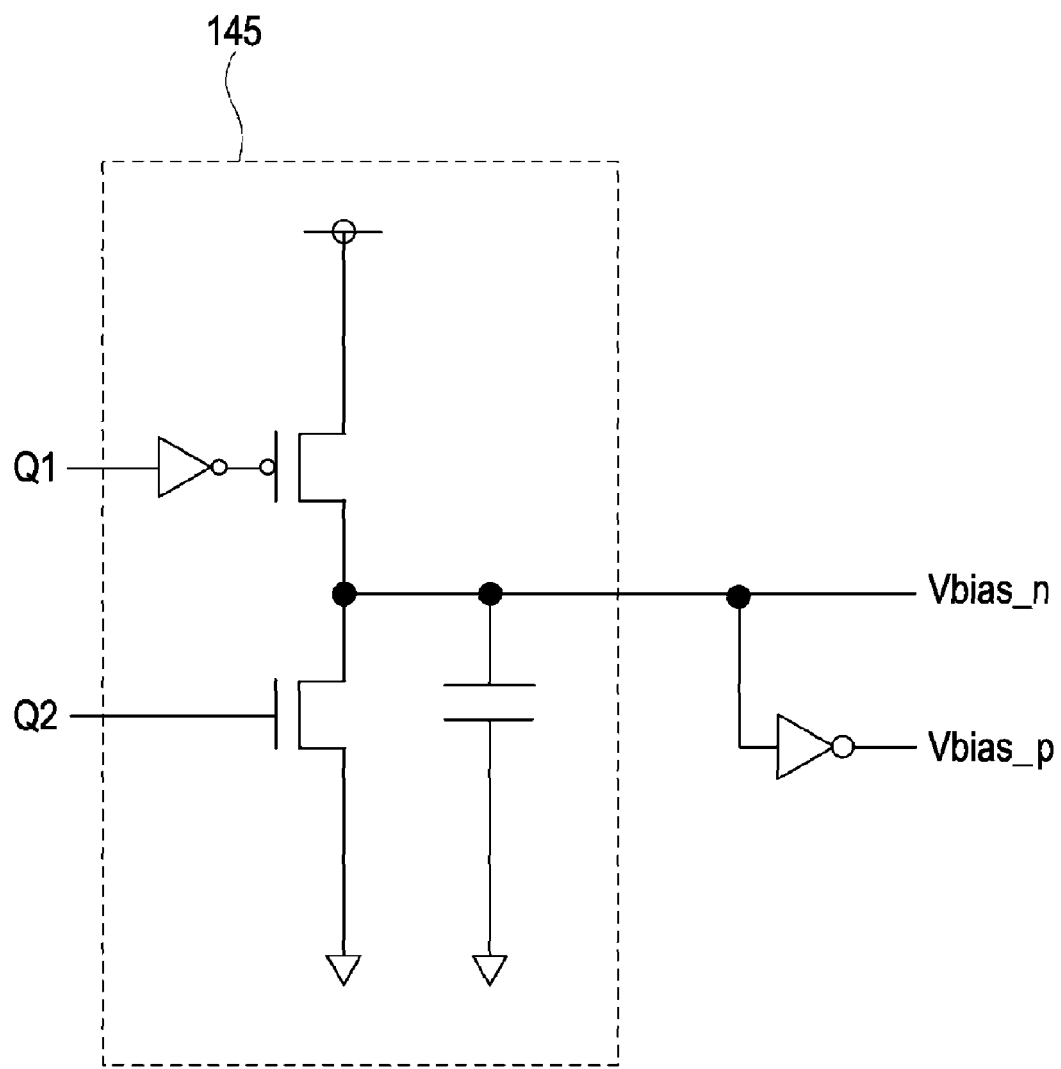
FIG. 21 is a diagram illustrating a configuration example of a charge pump.
Figure 22:
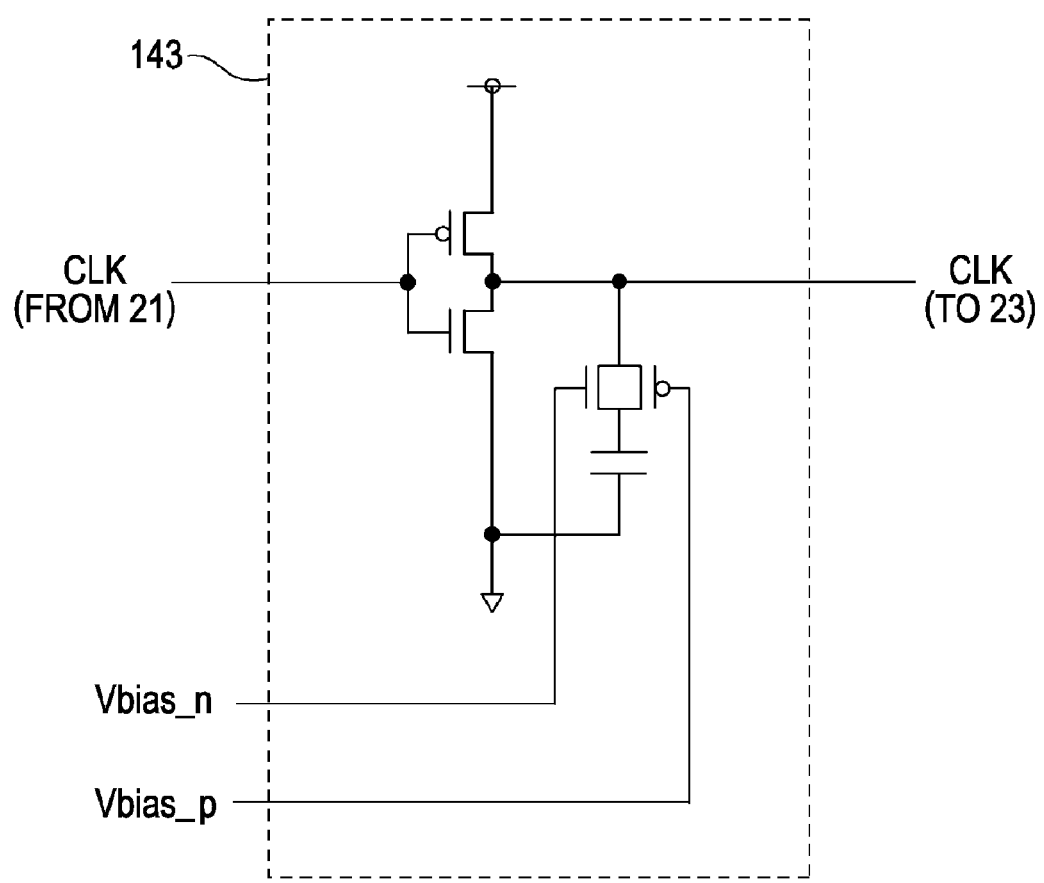
FIG. 22 is a diagram illustrating a configuration example of a digital delay line for fine adjustment.

In the case of this embodiment, the charge pump 145 is used for generating control signals for the digital delay line 143 in accordance with the determination outputs Q1 and Q2 of the phase comparison circuit 27. Note that the digital delay line 143 is configured of the first stage portion of the digital delay line 23, as shown in FIG. 22. Accordingly, the charge pump 145 generates bias voltages Vbias_n and Vbias_p (analog voltage) for open/close driving of the CMOS switches. FIG. 21 shows a circuit configuration of the charge pump 145.

The charge pump 145 shown in FIG. 21 is configured of an inverter, CMOS switch, and retentive capacitance. In the event that the determination output Q1 is "H" level, the charge pump 145 operates so as to charge the retentive capacitance with power source voltage, that is to say, to change output voltage to power source potential.

On the other hand, in the event that the determination output Q2 is "H" level, the charge pump 145 operates so as to charge the retentive capacitance with grounding voltage, that is to say, to extract the load of the retentive capacitance and change the output voltage to grounding voltage.

As a result, in the event that the phase is advanced (the determination output is "H" level), the CMOS switch is controlled closed, and the delay amount increases at the digital delay line 143. On the other hand, in the event that the phase is advanced (the determination output is "L" level), the CMOS switch is controlled opened, and the delay amount decreases at the digital delay line 143. That is to say, operation of whether or not to add one increment delay amount is realized by the digital delay line 143 and charge pump 145.

(b) Operations and Advantages of the Clock Signal Generating Circuit

In the case of the clock signal generating circuit 141 according to the present embodiment, the phase relation is detected at the point that the reset operation ends, and in the following operating period, both the fine adjustment digital delay line 143 and coarse digital delay line 23 are driven and controlled in accordance with the amount of phase detected.

Upon phase lock being eventually detected, supply of shift clocks SCLK to the ring-type shift register 31 for controlling coarse adjustment is stopped, and the control amount at this point is saved. Note that in the event that phase difference is generated following phase lock, the charge pump 145 independently restarts phase fine adjustment. This is because the shift clock SCLK for the coarse adjustment ring-type shift register 31 has been subjected to frequency division, meaning that there is margin in response to phase difference.

Hierarchically executing control of delay amount in this way realizes a clock signal generating circuit to be realized wherein phase lock speed and fine adjustment are balanced. With the case of this embodiment as well, the shift clock SCLK where the input clock CLK1 has been frequency-divided is used for driving the coarse adjustment ring-type shift register 31. Accordingly, operating margin of the ring-type shift register 31 can be ensured, improving yield.

E Fifth Embodiment

This embodiment also illustrates a clock signal generating circuit capable of executing adjustment of delay amount hierarchically will be described. Description of this hierarchical structure will also be made regarding the case of two steps of coarse adjustment and fine adjustment, but both stages are driven with ring-type shift registers in the present embodiment.

(a) Configuration of Clock Signal Generating Circuit

FIG. 22 illustrates an internal configuration example of a delay synchronization loop type clock signal generating circuit 151 proposed by the Inventors in the present Specification. Note that components in FIG. 23 which correspond to those in FIG. 20 are denoted with the same reference numerals. Also, while FIG. 23 shows an application to the case of the first embodiment, it is clear that this can be applied to the second embodiment as well.

Figure 23:
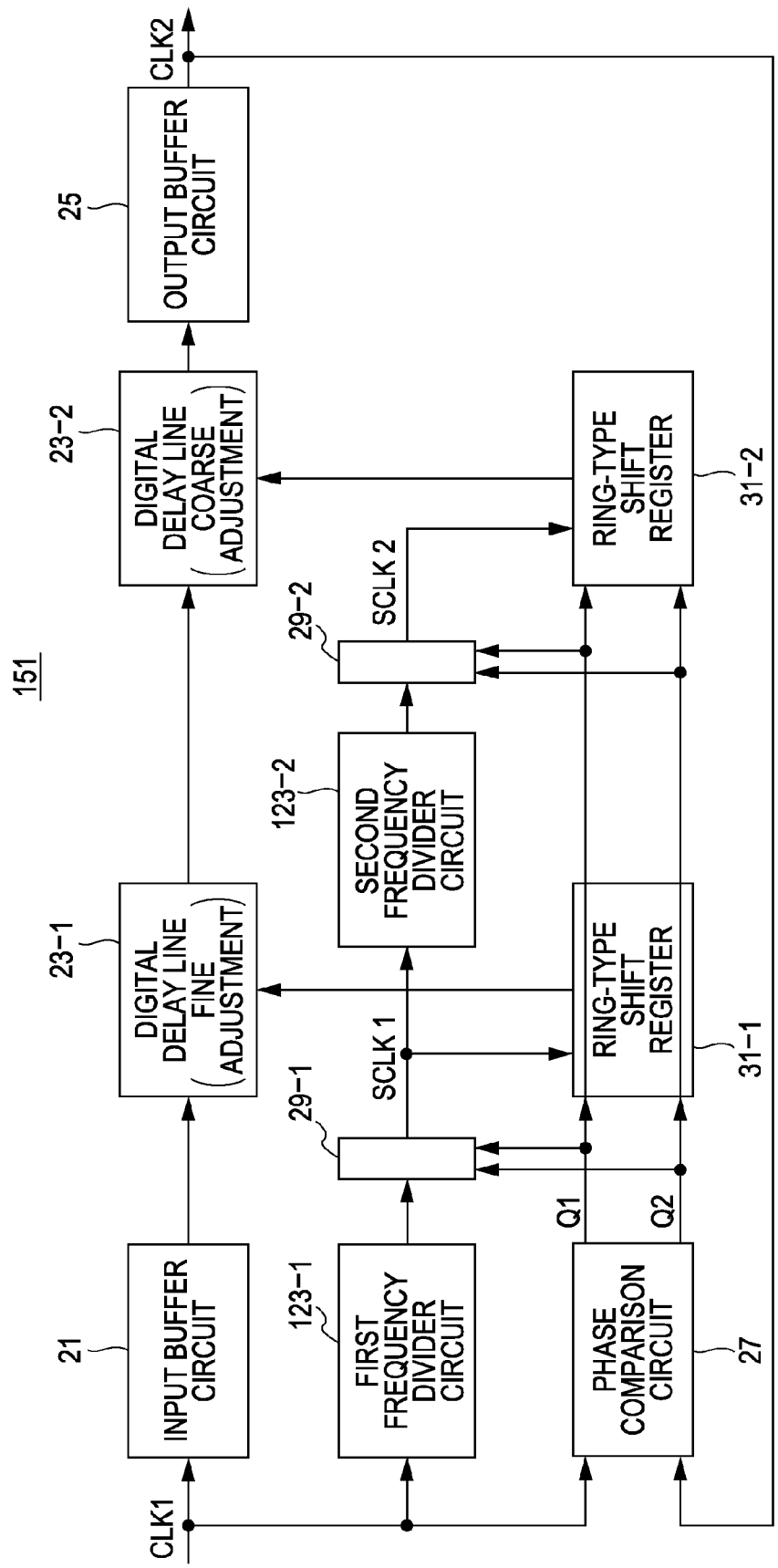
FIG. 23 is a diagram illustrating a configuration example of a clock signal generating circuit according to a fifth embodiment.

The clock signal generating circuit 151 shown in FIG. 23 is configured of the input buffer circuit 21, fine adjustment digital delay line 23-1, coarse adjustment digital delay line 23-2, output buffer circuit 25, phase comparison circuit 27, fine adjustment shift lock generating circuit 29-1, coarse adjustment shift lock generating circuit 29-2, fine adjustment ring-type shift register 31-1, coarse adjustment ring-type shift register 31-2, first frequency divider circuit 123-1 for fine adjustment, and second frequency divider circuit 123-2 for coarse adjustment.

With the present embodiment, the frequency of the shift clock SCLK2 input to the coarse adjustment ring-type shift register 31-2 is arranged to be lower than the frequency of the shift clock SCLK1 input to the fine adjustment ring-type shift register 31-1. Specifically, the input clock CLK1 is subjected to frequency dividing at the first frequency divider circuit 123-1 to generate a fine adjustment shift clock SCLK1, and further, this fine adjustment shift clock SCLK1 is subjected to frequency dividing at the second frequency divider circuit 123-2 to generate a coarse adjustment shift clock SCLK2. Setting of these shift clocks allows the adjustment sensitivity with the coarse adjustment ring-type shift register 31-2 to be made lower than the adjustment sensitivity with the fine adjustment ring-type shift register 31-1.

(b) Operations and Advantages of the Clock Signal Generating Circuit

In the case of the clock signal generating circuit 151 according to the present embodiment, both the fine adjustment digital delay line 23-1 and coarse digital delay line 23-2 are driven and controlled in accordance with the amount of phase detected.

Upon phase lock being eventually detected, both the coarse adjustment ring-type shift register 31-2 and fine adjustment ring-type shift register 31-1 stop operations, and the control amount at this point is saved at the coarse adjustment ring-type shift register 31-2 and fine adjustment ring-type shift register 31-1.

Note that in the event that phase difference is generated following phase lock, the fine adjustment ring-type shift register 31-1 which has relatively high frequency of shift clock SCLK and high adjustment sensitivity independently restarts phase fine adjustment, and executes fine adjustment of delay amount.

Hierarchically executing control of delay amount in this way realizes a clock signal generating circuit to be realized wherein phase lock speed and fine adjustment are balanced. With the case of this embodiment, two types of shift clocks, SCLK1 and SCLK2, obtained by frequency division of the input clock CLK1, are used for driving the coarse adjustment ring-type shift register 31-2 and fine adjustment ring-type shift register 31-1. Accordingly, Accordingly, operating margin of the ring-type shift registers 31-1 and 31-2 can be ensured, improving yield.

F Sixth Embodiment

Here, a clock signal generating circuit having a function for handling a state wherein the phase difference of the input clock CLK1 and output clock CLK2 is locked at a state 180° off (a pseudo-locked state) will be described. As described above, in the event of using insulating substrates such as glass substrates or the like, thin-film transistors formed on the face thereof have greater property irregularities as compared with transistors formed on a silicon wafer.

Figure 24:
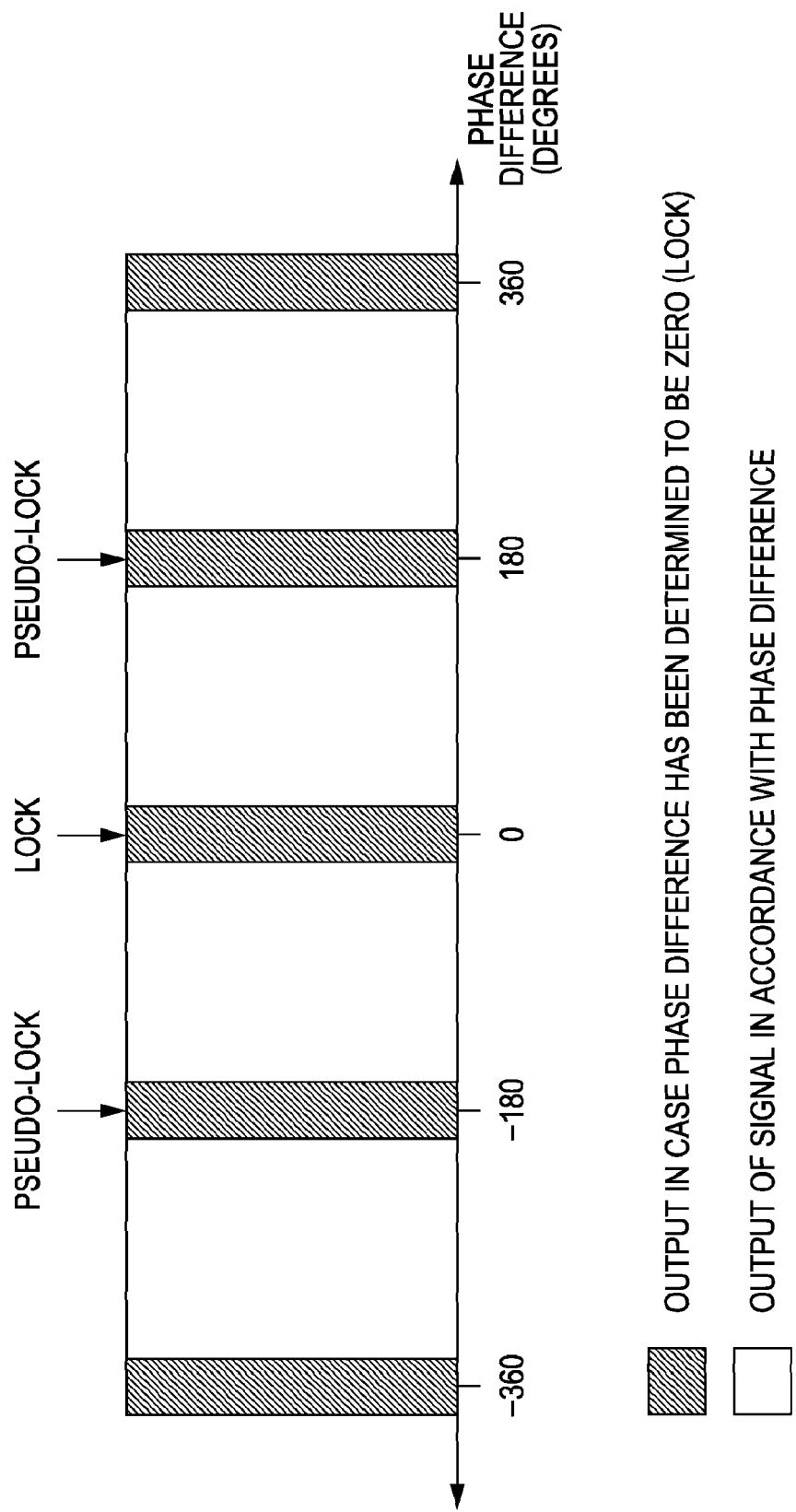
FIG. 24 is a diagram for explaining a pseudo lock state.

Accordingly, with a process wherein thin-film transistors making up the clock signal generating circuit have great property irregularities, implementation of a function realizing escape of such a pseudo-phase lock state such as shown in FIG. 24, and realizing a proper phase lock state, is desired. The present embodiment addresses this function.

(a) Configuration of Clock Signal Generating Circuit

Figure 25:
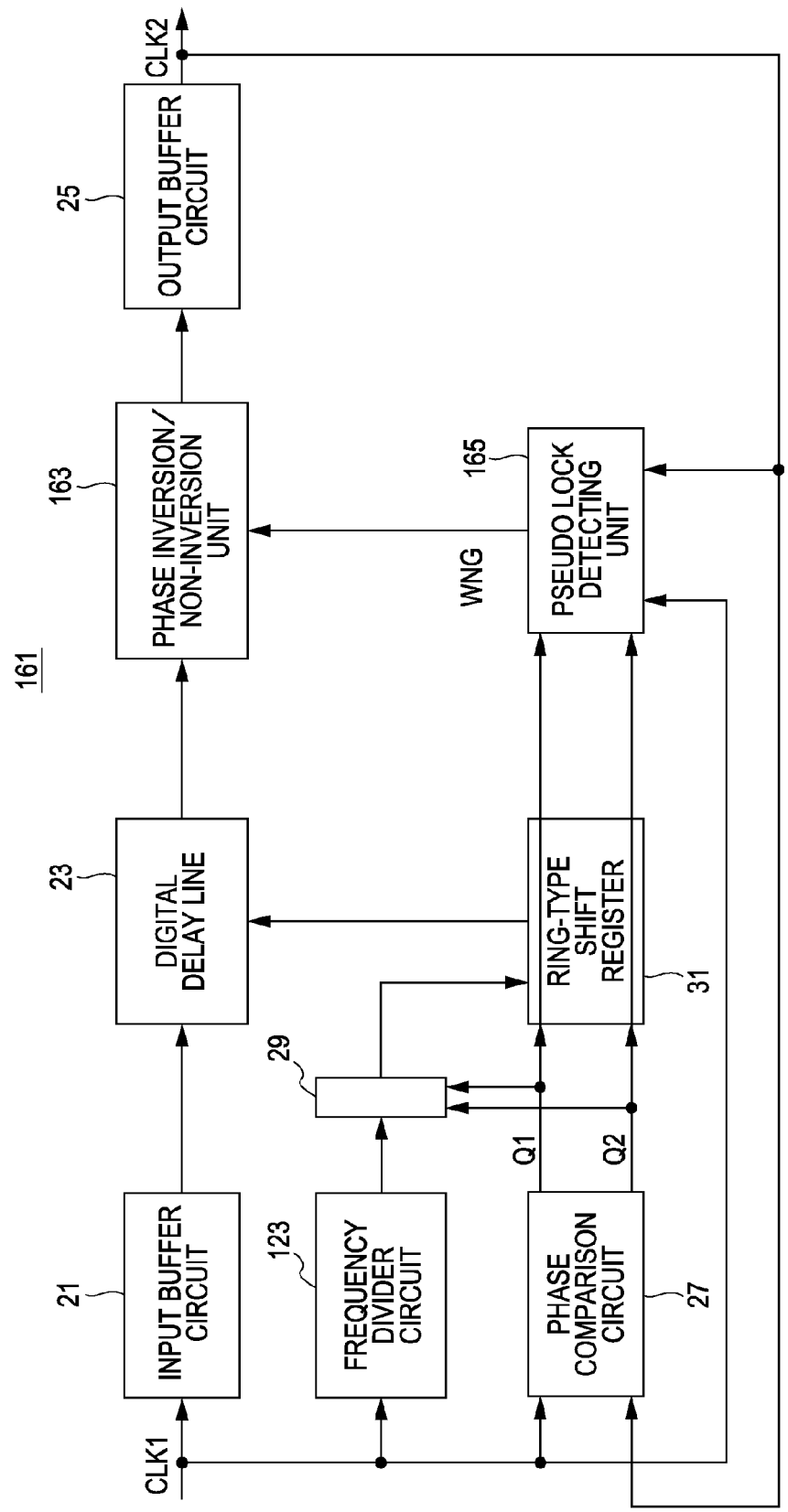
FIG. 25 is a diagram illustrating a configuration example of a clock signal generating circuit according to a sixth embodiment.

FIG. 25 illustrates an internal configuration example of a delay synchronization loop type clock signal generating circuit 151 proposed by the Inventors in the present Specification. Note that components in FIG. 22 which correspond to those in FIG. 18 are denoted with the same reference numerals.

The clock signal generating circuit shown in FIG. 25 is configured of the input buffer circuit 21, digital delay line 23, output buffer circuit 25, phase comparison circuit 27, shift lock generating circuit 29, ring-type shift register 31, frequency divider circuit 123, phase inversion/non-inversion unit 163, and pseudo lock detecting unit 165.

Note that while FIG. 25 shows a circuit configuration wherein the phase inversion/non-inversion unit 163 and pseudo lock detecting unit 165 have been added to the clock signal generating circuit 121 in the application of the third embodiment to the first embodiment, it is clear that the phase inversion/non-inversion unit 163 and pseudo lock detecting unit 165 may be added to the clock signal generating circuit 131 (FIG. 19) in the application of the third embodiment to the second embodiment.

What is new with this configuration is the phase inversion/non-inversion unit 163 situated partway between the digital delay line 23 and buffer circuit 26, and the pseudo lock detecting unit 165 which is the control unit thereof. The following is a description of just the phase inversion/non-inversion unit 163 and pseudo lock detecting unit 165 which are the new components.

The phase inversion/non-inversion unit 163 is a circuit for inverting and outputting clocks input from the digital delay line 23, or outputting the input clocks with no inversion. This the phase inversion/non-inversion unit 163 functions as a "lock state disengaging unit ". As shown in FIG. 24, in the pseudo lock state, the phase difference of the input clock CLK1 and output clock CLK2 are off by 180°.

Upon detecting a pseudo lock state, the phase inversion/non-inversion unit 163 operates to invert the phase of the input clock by 180°. In a state other than the a pseudo lock state, the phase inversion/non-inversion unit 163 outputs the input clocks with no change. Switching between inversion/non-inversion of the phase inversion/non-inversion unit 163 is performed by control signals provided from the pseudo lock detecting unit 165.

Figure 26:
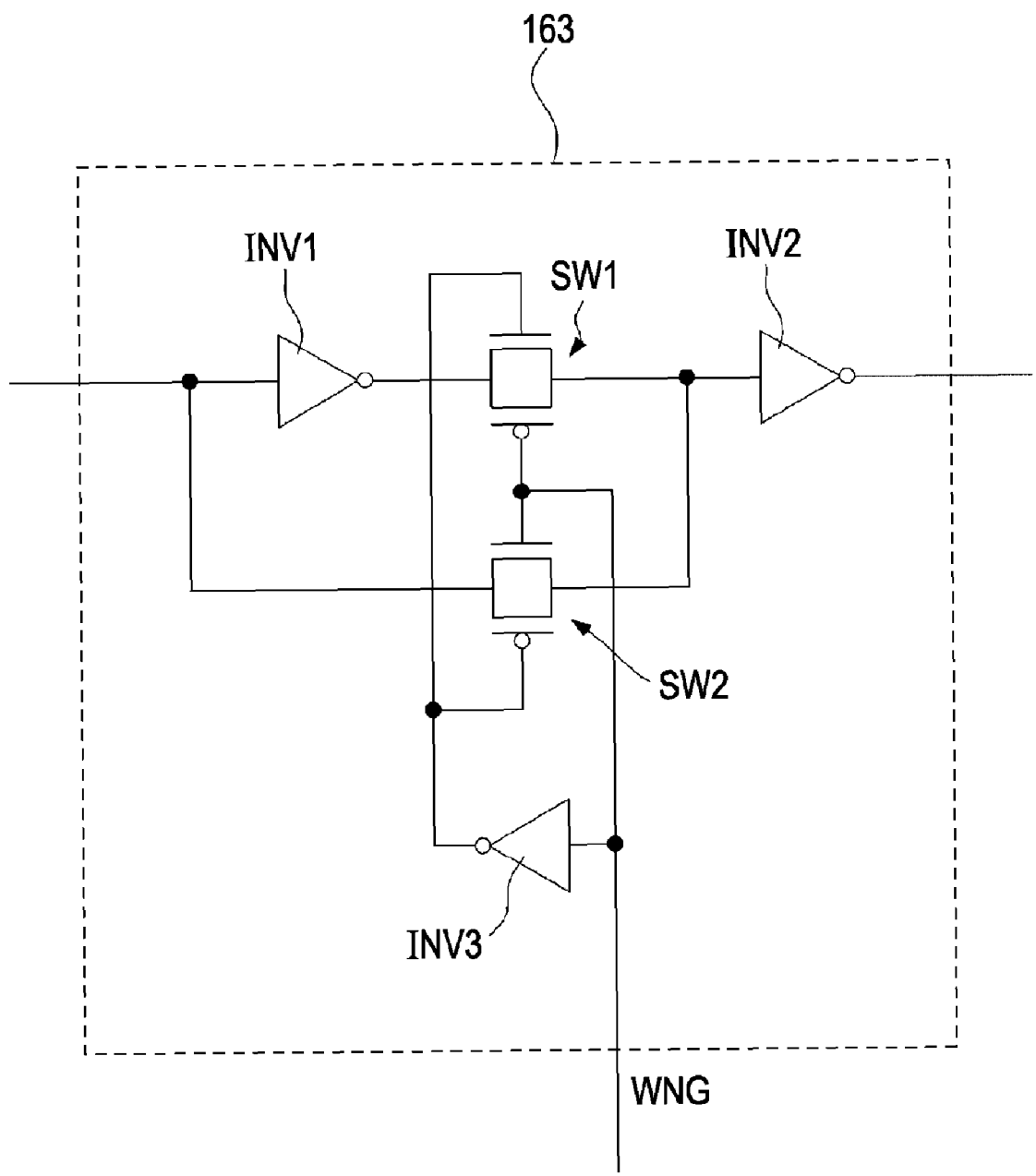
FIG. 26 is a diagram illustrating an internal configuration example of a phase inversion/non-inversion unit.

FIG. 26 shows a circuit example of the phase inversion/non-inversion unit 163. The phase inversion/non-inversion unit 163 as shown in FIG. 26 has a transmission path where two stages of inverters INV are passed through (path of a first CMOS switch) and a transmission path where one inverter INV is passed through (path of second CMOS switch). Just one transmission path is selected by the first and second CMOS switches.

That is to say, the first and second CMOS switches are wired such that the operations thereof are mutually exclusive. Accordingly, the phase inversion/non-inversion unit 163 shown in FIG. 26 inverts the connection of pseudo lock detecting signals WNG. The inverter INV is used for inverting the polarity of the pseudo lock detecting signals WNG.

Figure 27A:
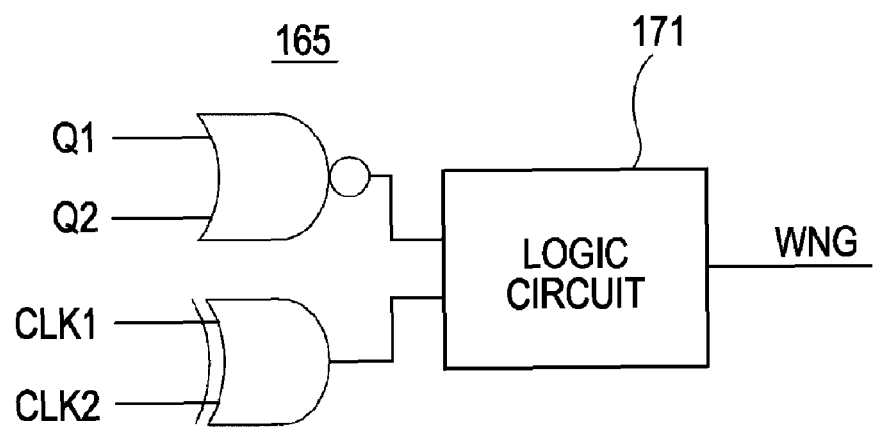
FIG. 27 is a diagram illustrating a gate configuration of a voltage control type delay line.
Figure 27B:
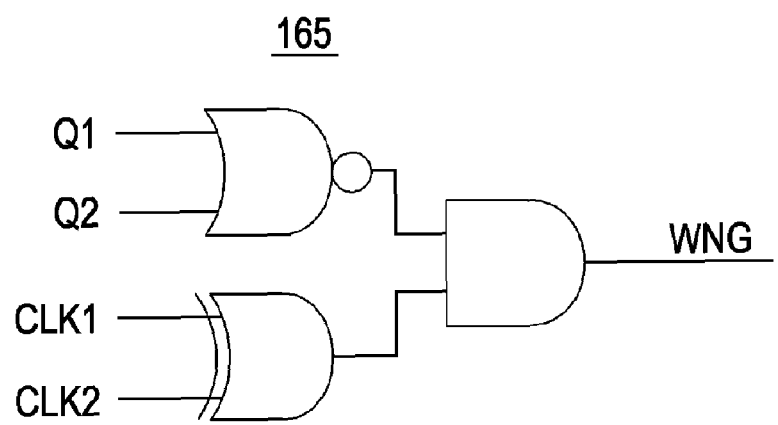

This pseudo lock detecting unit 165 is a circuit for detecting a pseudo lock state between the input clock CLK1 and the output clock CLK2. FIGS. 27A and 27B illustrate the circuit configuration of the pseudo lock detecting unit 165. FIG. 27A shows a circuit configuration in a case of combining gate circuits and the logic circuit 171, and FIG. 27B shows a circuit configuration in a case of combining gate circuits alone.

FIG. 28 illustrates the input/output relation regarding the pseudo lock detecting unit 165. As indicated by heavy lines in FIG. 28, in the event that the output signals Q1 and Q2 are both "L" level and also the signal levels of the input clock CLK1 and the output clock CLK2 differ, the pseudo lock detecting unit 165 determines that the input clock CLK1 and the output clock CLK2 are in a pseudo lock state.

Detection of both output signals Q1 and Q2 being "L" level is made at a NOR gate in FIG. 27A and FIG. 27B. Also, the fact that the signal levels of the input clock CLK1 and the output clock CLK2 differ is detected at the XOR gate in FIG. 27A and FIG. 27B. The logic circuit 171 realizes the same logic operations as an AND gate.

This pseudo lock detecting unit 165 converts the pseudo lock detecting signal WNG to "H" level when detecting a pseudo lock state. In the event that a pseudo lock state is not detected, the pseudo lock detecting unit 165 outputs "L" level pseudo lock detecting signals WNG.

(b) Operations and Advantages of the Clock Signal Generating Circuit

With the clock signal generating circuit 161 according to the present embodiment, even in a case that the determination outputs Q1 and Q2 of the phase comparison circuit 27 are both "L" level and determination is made of a phase lock state, the pseudo lock detecting unit 165 determines whether the lock state is true or false, and in the event of a determination of false (pseudo lock), the phase inversion/non-inversion unit 163 can invert the phase of the output clock of the digital delay line.

The phase difference between a pseudo lock state and a true lock state is 180°, so the output clock CLK2 can be changed to the proper lock phase with this inversion operation. Thus, with this clock signal generating circuit 201, even in the event that the phase of the output clock CLK2 is erroneously caught in a pseudo lock state, this state can be escaped and brought in a proper lock state in a sure manner.

Note that while the phase inversion/non-inversion unit 163 inverts the clock phase by 180° with the present embodiment, the amount of phase change at the time of detecting pseudo lock state is not restricted to 180°, as long as the state can be changed to a state of phase relation where normal phase comparison operations can converge the phases to a lock state. For example, changing the phase by 90° or more from a pseudo lock state will allow normal phase comparison operations to converge the phases to a lock state.

G Other Configuration Examples

G-1 Ring-Type Shift Register

While description has been made above with the embodiments that the ring-type shift register is a multi-stage connection circuit of D flip-flops, the ring-type shift register can be configured using other types of flip-flop circuits, including Set-Reset (SR) flip-flops.

G-2 Relation of Input/Output Clocks

While description has been made above with the embodiments that the input clock CLK1 and output clock CLK2 are of the frequency, the present invention is not restricted to this, and the clock frequencies may be different.

G-3 Shift Clock

While description has been made above with the embodiments that the shift clock SCLK is generated as a frequency division clock (including frequency re-division clock) of the input clock CLK1 or output clock CLK2, the shift clock SCLK is not restricted to the phase relation as if the frequency is lower than that of the input clock CLK1 or output clock CLK2, as long as sufficient operating margin can be ensured.

G-4 Insulating Substrate

The above embodiments have been described regarding active elements making up the clock signal generating circuit being directly formed on the glass substrate 3, which is an insulating substrate, using thin-film forming techniques or printing techniques using polysilicon (regardless of whether high temperature or low temperature), amorphous silicon, organic material, and so forth. However, the insulating substrate on which the clock signal generating circuit is formed is not restricted to this, and may be another insulating substrate such as plastic mounted on the glass substrate 3, or the like.

G-5 Examples of Application to Display Panels

The clock signal generating circuit described in the above embodiments is not restricted to application to liquid crystal panels, and can also be applied to organic EL panels, plasma displays, field-emission displays, and other light-emitting display panels.

G-6 Example of Application to Electronic Equipment (a) System Example

The above-described clock signal generating circuit is not restricted to application to system displays, and can be applied to other electronic equipment as well. An example of electronic equipment is described below.

Figure 29:
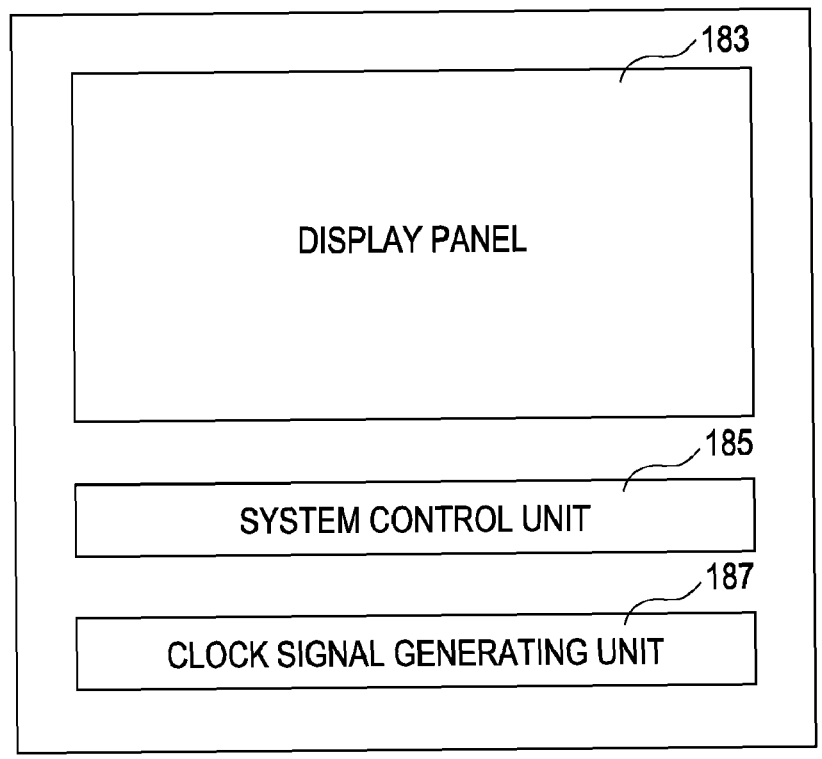
FIG. 29 is a diagram illustrating a system configuration example of electronic equipment.

FIG. 29 shows a system configuration example of electronic equipment to which a display panel is mounted. This electronic equipment is configured of a display panel 183, a system control unit 185, and a clock signal generating unit 187. The clock signal generating circuit 187 may be formed on the substrate of the display panel 183, or may be formed on a separate substrate.

The system control unit 185 is a processing unit for controlling the operations of the entire system, and is configured of a CPU, for example. Also provided are interfaces in accordance with the usage of the electronic equipment.

Figure 30:
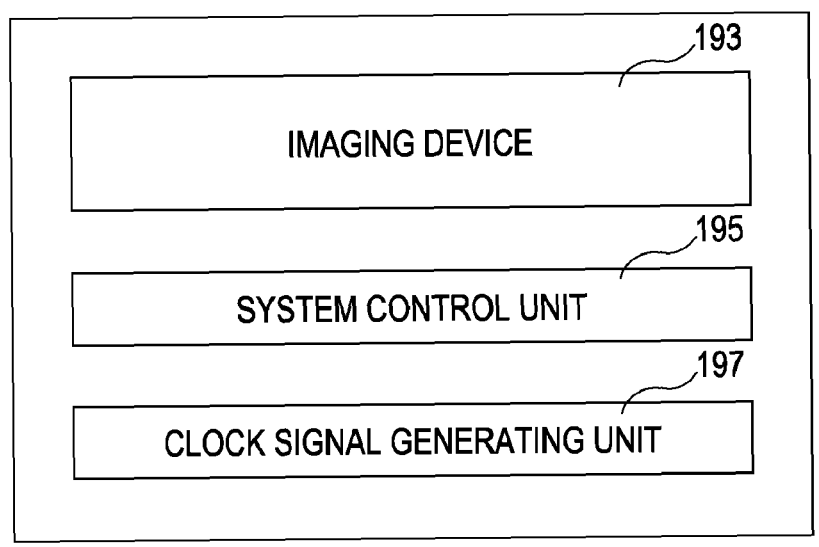
FIG. 30 is a diagram illustrating a system configuration example of electronic equipment.

FIG. 30 illustrates a system configuration example wherein an imaging device (imager) is mounted on the electronic equipment. This electronic equipment 191 is configured of the imaging device 193, system control unit 195, and clock signal generating circuit 197. The clock signal generating circuit 197 here is a circuit for generating operating clocks of the imaging device, and as with the case of the above embodiment, the clock signal generating circuit 197 may be formed on the substrate of the imaging device 197 or may be formed on another substrate.

The system control unit 195 is a processing unit for controlling the operations of the entire system, and is configured of CPU, for example. Also provided are interfaces in accordance with the usage of the electronic equipment. A configuration may also be conceived as a lone sensing device, with no system control unit 195 provided.

(b) Example of External Appearance of Electronic Equipment

The following is a description of examples of the external appearance of the electronic equipment. The clock signal generating circuit is built into some part of the casing.

Figure 31:
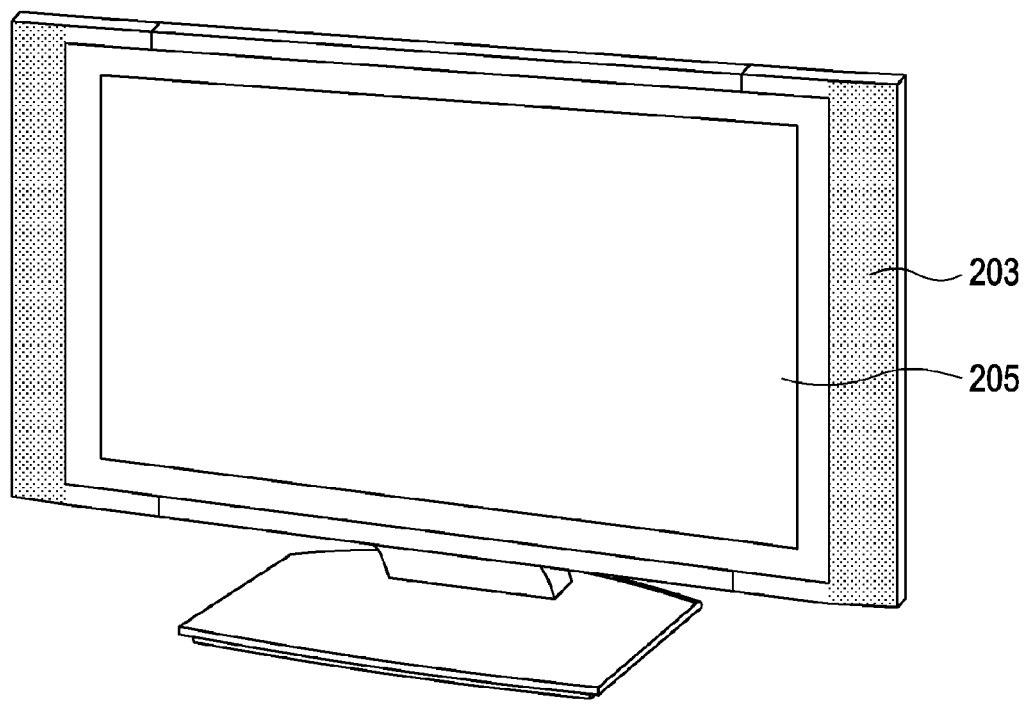
FIG. 31 is a diagram illustrating an external view of electronic equipment.

FIG. 31 is an example of the external view of a television receiver 201. The television receiver 201 has a configuration wherein a display panel 205 is positioned at the front face of a front panel 203 serving as the casing.

Figure 32A:
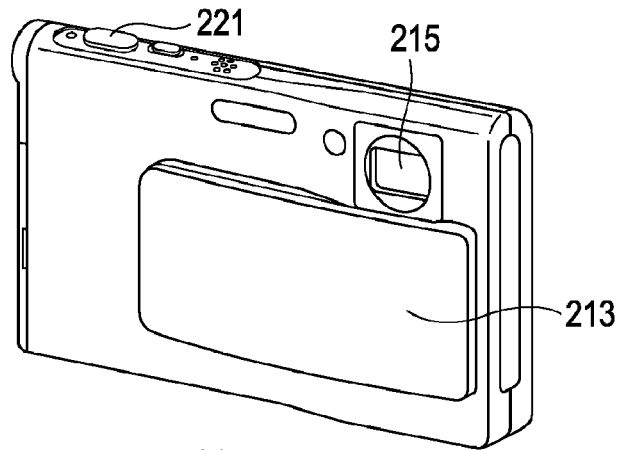
FIGS. 32A and 32B are diagram illustrating external views of electronic equipment.
Figure 32B:
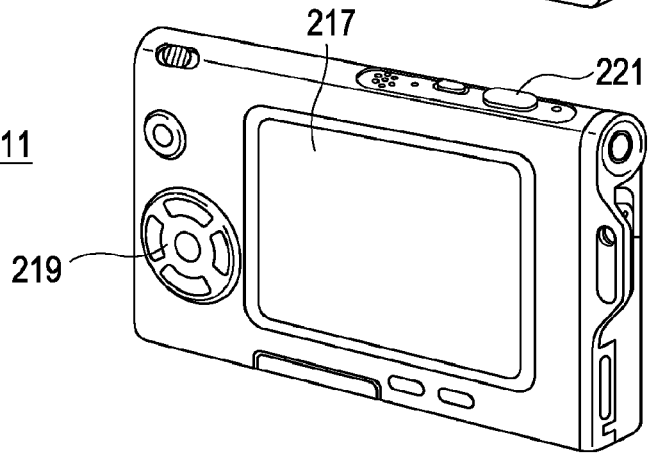

FIGS. 32A and 32B are examples of the external view of a digital camera 211. FIG. 32A is an example of the external view of the digital camera from the front side (subject side), and FIG. 32B is an example of the external view of the digital camera from the rear side (photographer side). The digital camera 211 has a protective cover 213, photography lens unit 215, display panel 217, control switch 219, a shutter button 221, and so forth, disposed on the casing.

Figure 33:
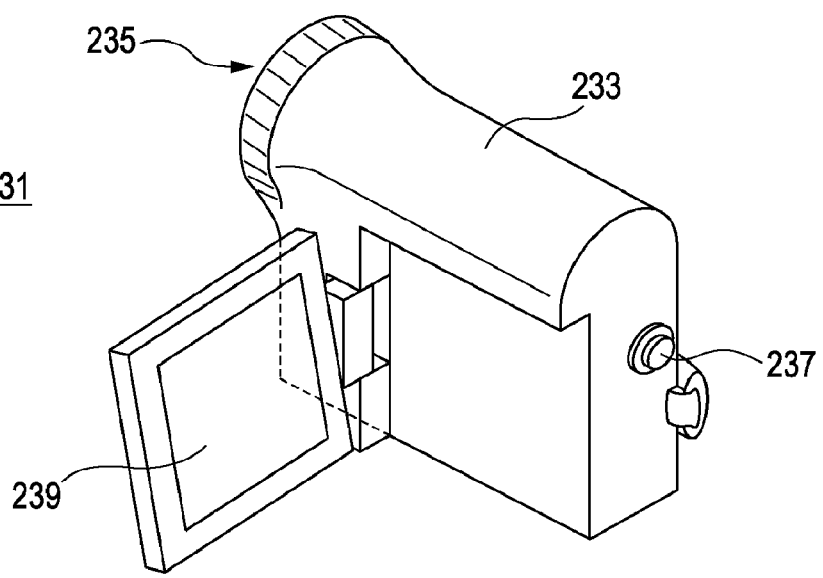
FIG. 33 is a diagram illustrating an external view of electronic equipment.

FIG. 33 is an example of the external view of a video camera 231. The video camera 231 has a video lens 235 for shooting a subject at the front side of a main unit 233, and a shooting start/stop switch 237 disposed on the rear face of the main unit 2383, with a display panel 239 provided to a side face of the main unit 233.

Figure 34A:
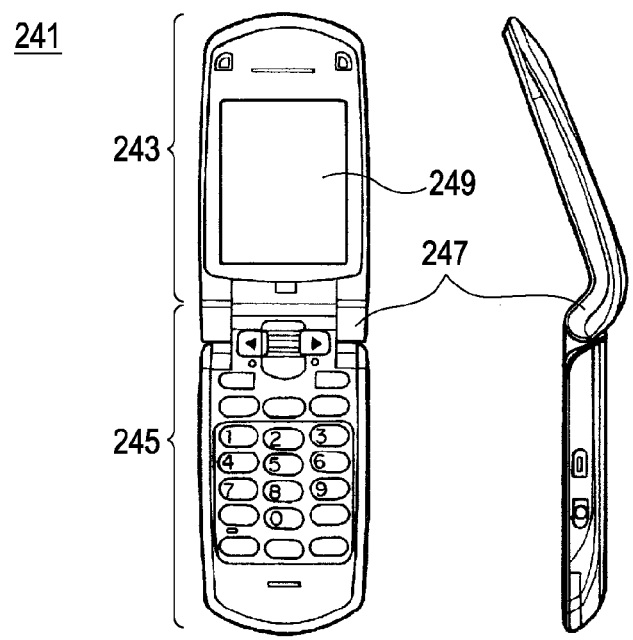
FIGS. 34A and 34B are diagram illustrating external views of electronic equipment.
Figure 34B:
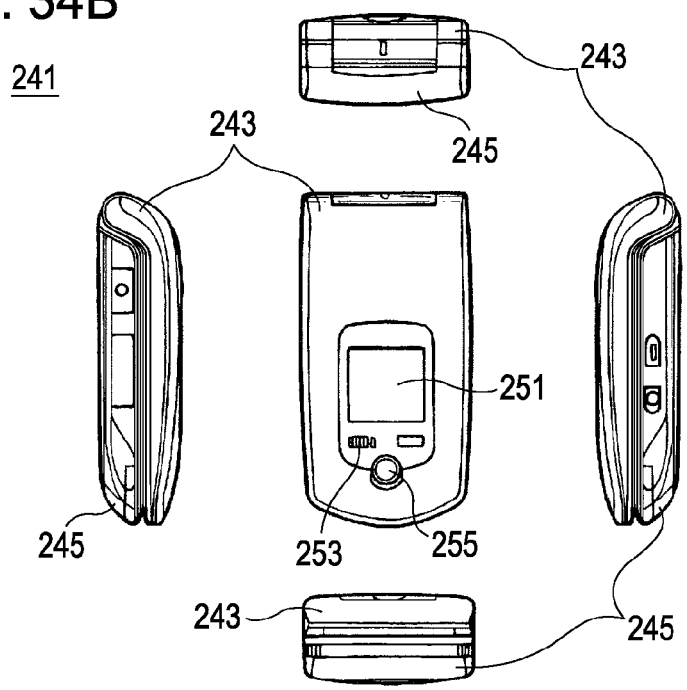

FIGS. 34A and 34B are examples of the external view of a clamshell cellular telephone 241. FIG. 34A is an example of the external view of the cellular telephone 241 when opened, and FIG. 34B is an example of the external view of the cellular telephone 241 when folded. The cellular telephone 241 has a configuration wherein an upper casing 243, lower casing 245, linkage unit (hinge unit in this example) 247, main display panel 249, supplementary display panel 251, picture light 253, and photography lens 255 are disposed on the face of the casing.

Figure 35:
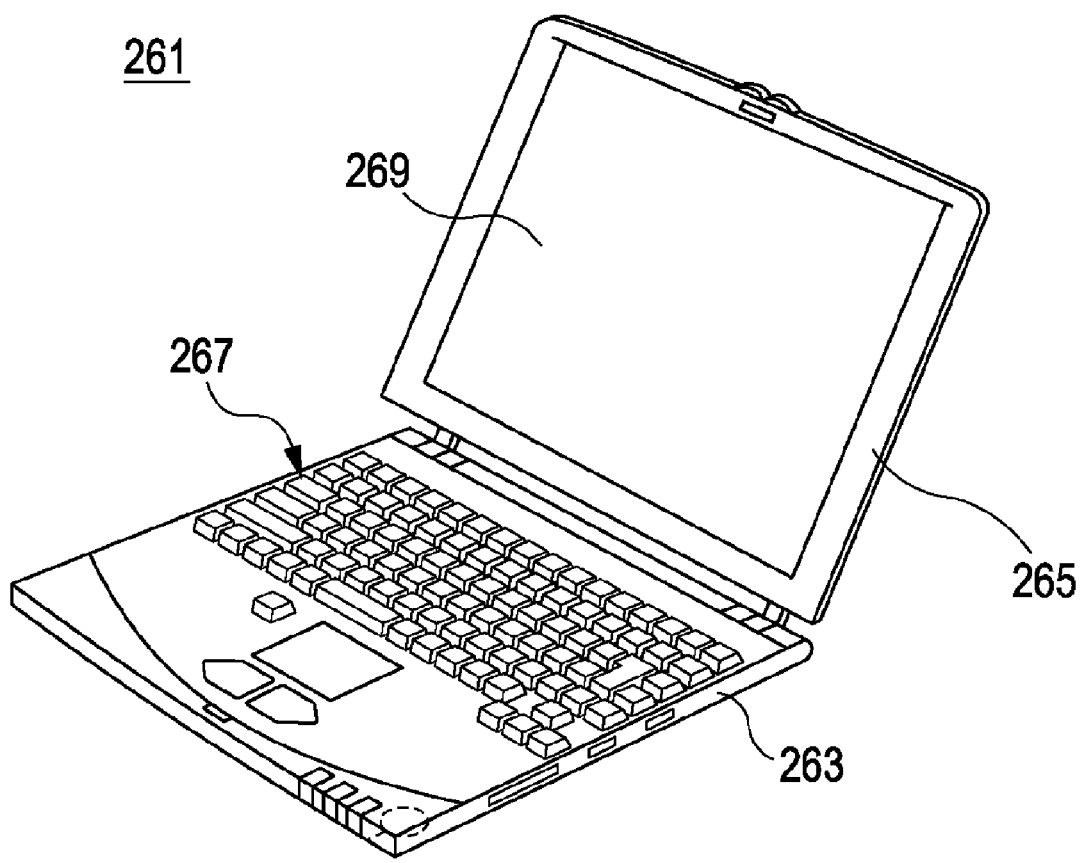
FIG. 35 is a diagram illustrating an external view of electronic equipment.

FIG. 35 is an example of the external view of a computer 261. The computer 261 is configured of a lower casing 263, side casing 335, keyboard 267, and display panel 269.

In addition to these examples, the clock signal generating circuit can be implemented in other electronic equipment, such as audio players, gaming consoles, electronic book readers, electronic dictionaries, and so forth.

G-7 Phase Comparison Circuit

Embodiments have been described above with regard to a case wherein the phase comparison circuit 27 includes the circuit configuration shown in FIG. 4. However, the circuit configuration shown in FIG. 36 can be employed for the phase comparison circuit 27. That is to say, the phase comparison circuit 27 can be configured as a D flip-flop 271 operating with the output clock CLK2 as the clock thereof. In this case, the input clock CLK1 can be connected to the D input terminal.

Figures 36, 37:
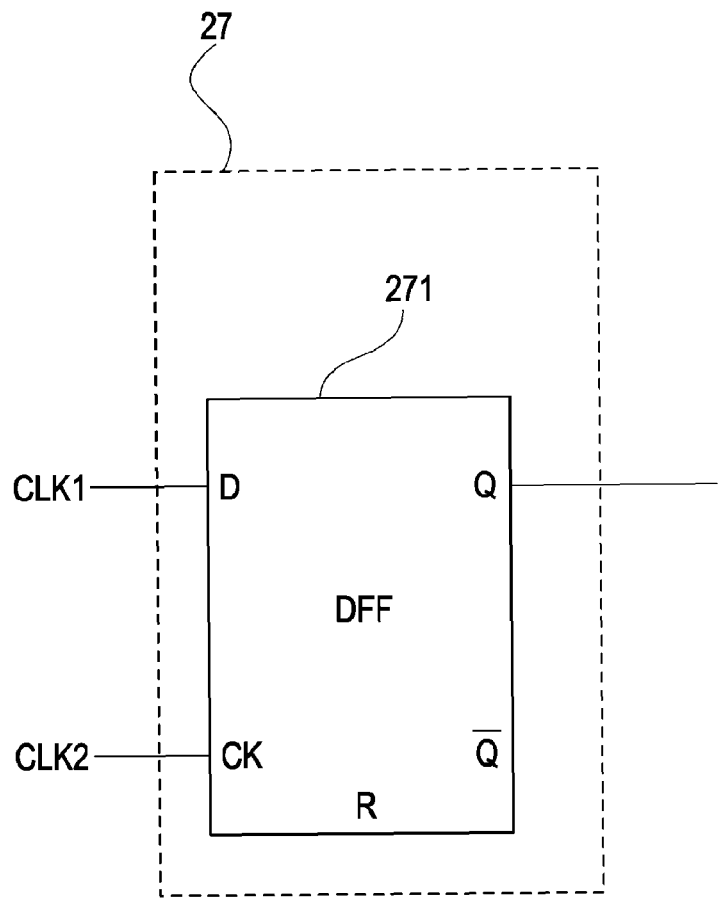
FIG. 36 is a diagram illustrating another configuration example of a phase comparison circuit.
FIG. 37 is a diagram for describing the operating state of the phase comparison circuit shown in FIG. 36.

In the case of this circuit configuration, the phase comparison circuit 27 operates with the relation shown in FIG. 37. That is to say, in the event that the state is a locked state or the phase of the output clock CLK2 is behind the phase of the input clock CLK1, the Q output is "H" level, and in the event that the phase of the output clock CLK2 is ahead of the phase of the input clock CLK1, the Q output is "L" level.

Figure 38:
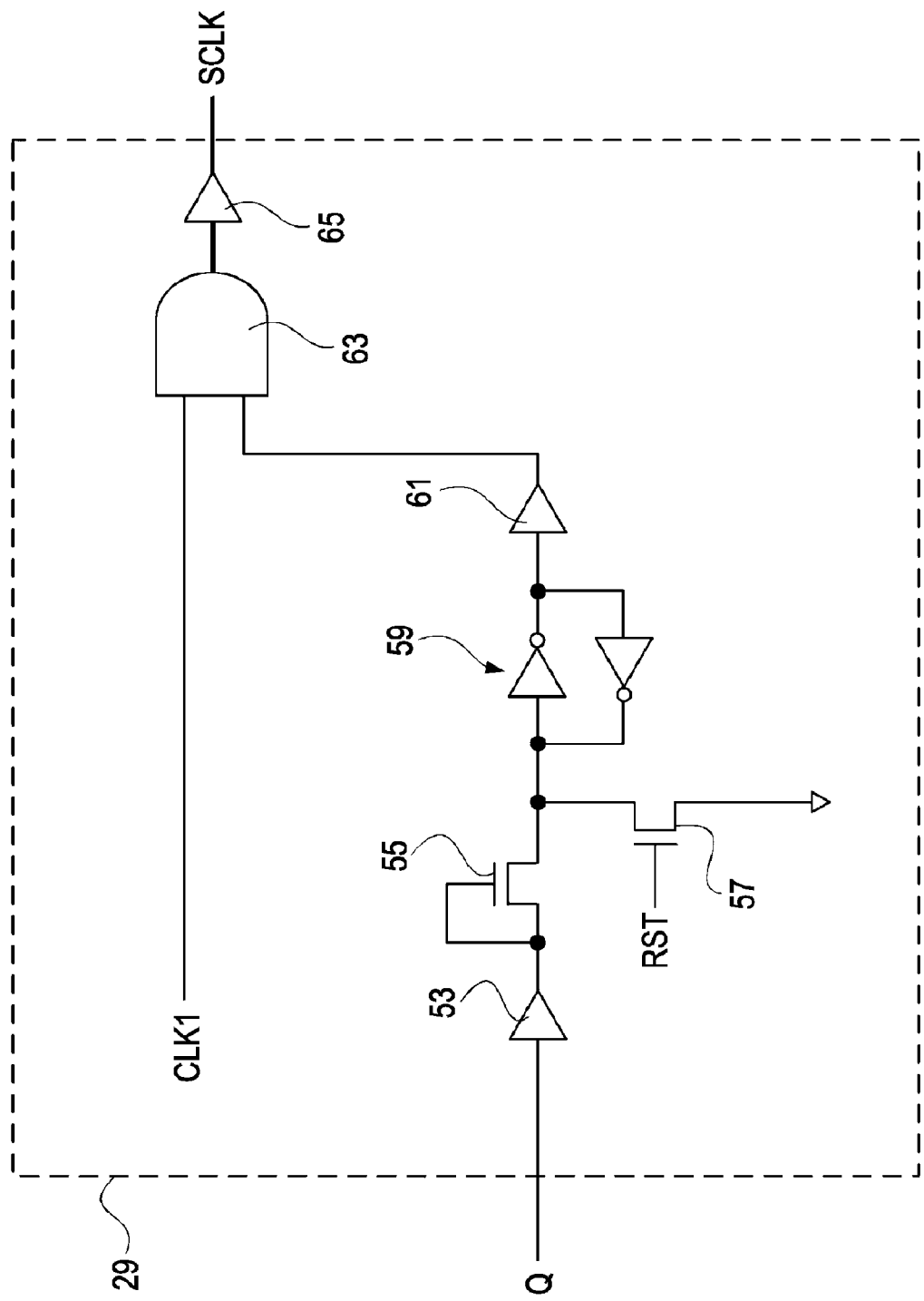
FIG. 38 is a diagram illustrating a configuration example of a shift clock generating unit to which the phase comparison circuit shown in FIG. 36 has been applied.

This Q output is the same as the output of the charge pump 51 (FIG. 16) making up the shift clock generating unit 29. Accordingly, in the event of using the phase comparison circuit 27 having the circuit configuration shown in FIG. 36, the circuit configuration of the shift clock generating unit 29 can be that shown in FIG. 38. That is to say, a circuit configuration wherein the charge pump 51 is omitted from the circuit configuration of the shift clock generating unit 29 will suffice.

Figure 39:
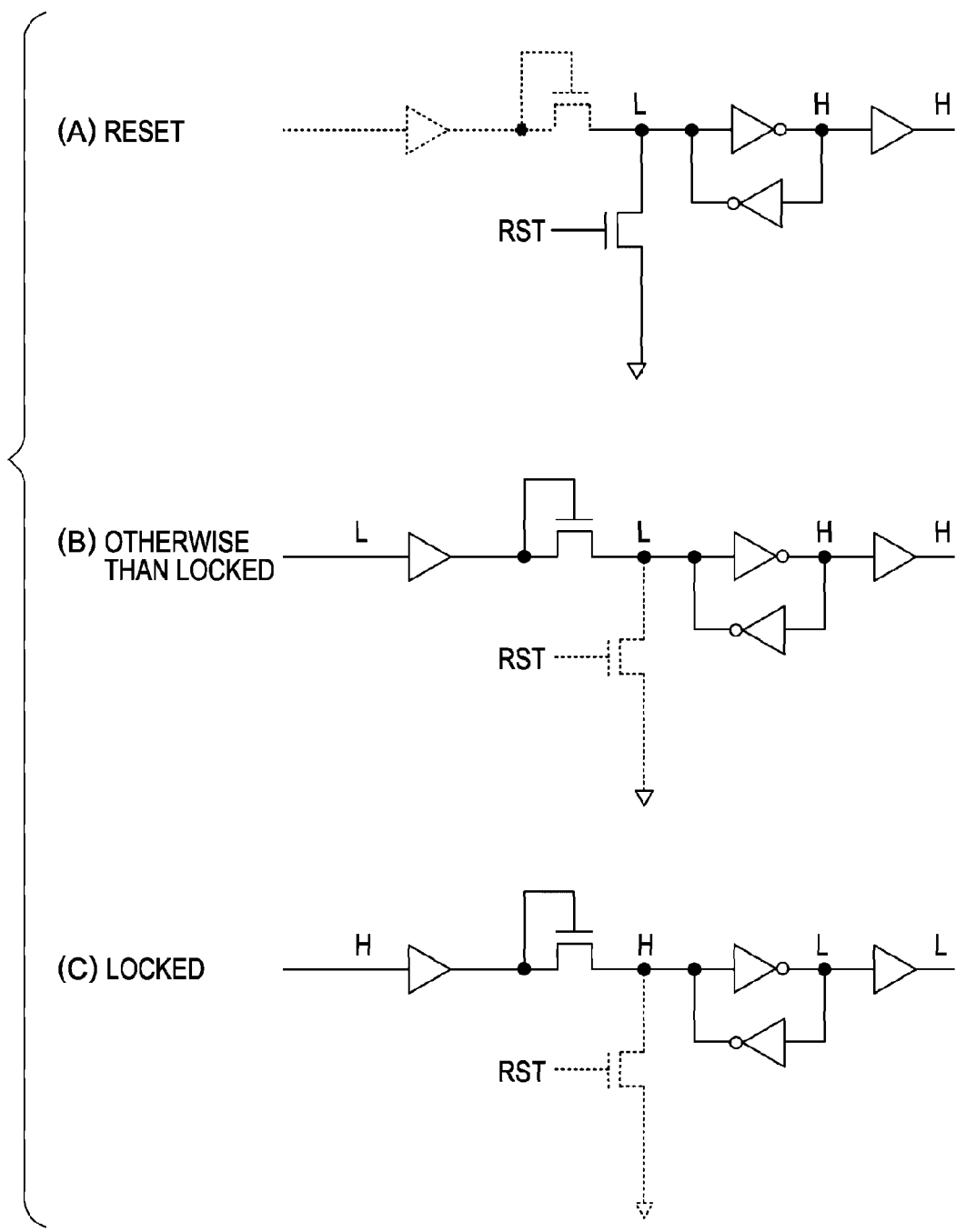
FIG. 39 is a diagram for explaining the operating state of the shift clock generating unit shown in FIG. 38.

The operations of the shift clock generating unit 29 in the event of employing this circuit configuration are shown in FIG. 39. The operations shown in FIG. 3955 are identical to the operations shown in FIG. 8, described with the first embodiment.

G-8 Others

Various modifications may be made of the above-described embodiments within the spirit and scope of the present invention, including for example, various modifications and applications created or obtained as combinations, based on the descriptions in the present Specification. It should be understood by those skilled in the art that various modifications, combinations, sub-combinations and alterations may occur depending on design requirements and other factors insofar as they are within the scope of the appended claims or the equivalents thereof.

What is claimed is:

1. A delay synchronization loop type clock signal generating circuit, comprising:
 a digital delay line for delaying a first clock signal and generating a second clock signal;
 a ring type shift register for setting time length of said digital delay line by flip-flop output of each stage thereof; and
 a delay amount control unit for controlling supply of shift clocks to said ring-type shift register, based on a phase relation between said first clock signal and said second clock signal,
 wherein,
  said digital delay line is a configuration of a serial connection of (a) a first delay line for coarse adjustment of delay time and (b) a second delay line for fine adjustment of delay time,
  said ring-type shift register is a configuration of (a) a first ring-type shift register corresponding to said first delay line and (b) a second ring-type shift register corresponding to said second delay line,
  said delay amount control unit is a configuration of (a) a first delay amount control unit corresponding to said first delay line and (b) a second delay amount control unit corresponding to said second delay line, and said shift clock which drives said first and second ring-type shift registers has a frequency lower than said first clock signal or said second clock signal.

2. A delay synchronization loop type clock signal generating circuit, comprising:
- a digital delay line for delaying a first clock signal and generating a second clock signal;
- a ring type shift register for setting the delay time length of said digital delay line by flip-flop output of each stage thereof; and
- a delay amount control unit for controlling supply of shift clocks to said ring-type shift register, based on phase relation between said first clock signal and said second clock signal, wherein,
- said digital delay line is a configuration of a serial connection of (a) a first delay line for coarse adjustment of delay time and (b) a second delay line for fine adjustment of delay time,
- said ring-type shift register is a configuration of (a) a first ring-type shift register corresponding to said first delay line and (b) a second ring-type shift register corresponding to said second delay line,
- said delay amount control unit is a configuration of (a) a first delay amount control unit corresponding to said first delay line and (b)a second delay amount control unit corresponding to said second delay line, and
- said shift clock signal is provided as frequency division output of said first clock signal.

3. A delay synchronization loop type clock signal generating circuit, comprising:
- a digital delay line for delaying a first clock signal and generating a second clock signal;
- a ring type shift register for setting the delay time length of said digital delay line by flip-flop output of each stage thereof; and
- a delay amount control unit for controlling supply of shift clocks to said ring-type shift register, based on phase relation between said first clock signal and said second clock signal, wherein,
- said digital delay line is a configuration of a serial connection of (a) a first delay line for coarse adjustment of delay time and (b) a second delay line for fine adjustment of delay time,
- said ring-type shift register is a configuration of (a) a first ring-type shift register corresponding to said first delay line and (b) a second ring-type shift register corresponding to said second delay line,
- said delay amount control unit is a configuration of (a) a first delay amount control unit corresponding to said first delay line and (b) a second delay amount control unit corresponding to said second delay line, and
- the frequency of the first shift clock signal input to said first ring-type shift register is lower than the frequency of the second shift clock signal input to said second ring-type shift register.

4. A delay synchronization loop type clock signal generating circuit, comprising:
- a digital delay line for delaying a first clock signal and generating a second clock signal;
- a ring type shift register for setting the delay time length of said digital delay line by flip-flop output of each stage thereof; and
- a delay amount control unit for controlling supply of shift clocks to said ring-type shift register, based on phase relation between said first clock signal and said second clock signal, wherein,
- said digital delay line is a configuration of a serial connection of (a) a first delay line for coarse adjustment of delay time and (b) a second delay line for fine adjustment of delay time,
- said ring-type shift register is a configuration of (a) a first ring-type shift register corresponding to said first delay line and (b) a second ring-type shift register corresponding to said second delay line,
- said delay amount control unit is a configuration of (a) a first delay amount control unit corresponding to said first delay line and (b) a second delay amount control unit corresponding to said second delay line, and
- in a case that new phase difference occurs in a state in which both coarse adjustment and fine adjustment delay time lengths have been set, first, only setting operations for fine adjustment delay time length are resumed.

5. A delay synchronization loop type clock signal generating circuit, comprising:
- a digital delay line for delaying a first clock signal and generating a second clock signal;
- a ring type shift register for setting the delay time length of said digital delay line by flip-flop output of each stage thereof; and
- a delay amount control unit for controlling supply of shift clocks to said ring-type shift register, based on phase relation between said first clock signal and said second clock signal, wherein,
- said digital delay line is a configuration of a serial connection of (a) a first delay line for coarse adjustment of delay time and (b) a second delay line for fine adjustment of delay time,
- said ring-type shift register performs setting of the delay time length of said first delay line,
- said digital delay amount setting unit performs setting of the delay time length of said second delay line, and
- said shift clock which drives said ring-type shift register has a frequency lower than said first clock signal or said second clock signal.

6. The clock signal generating circuit according to claim 5, wherein, in a case that new phase difference occurs in a state in which both coarse adjustment and fine adjustment delay time lengths have been set, first, only setting operations for fine adjustment delay time length are resumed.

7. A delay synchronization loop type clock signal generating circuit, comprising:
- a digital delay line for delaying a first clock signal and generating a second clock signal;
- a ring-type shift register for setting the delay time length of said digital delay line by flip-flop output of each stage thereof; and
- a delay amount control unit for controlling supply of shift clocks to said ring-type shift register, based on phase relation between said first clock signal and said second clock signal, wherein,
- said shift clock which drives said ring-type shift register has a frequency lower than said first clock signal or said second clock signal.

8. The clock signal generating circuit according to claim 7, wherein said shift clock signal is provided as frequency division output of said first clock signal.

9. A display panel module comprising:
- a display panel;
- a delay synchronization loop type clock signal generating circuit including (a) a digital delay line for delaying a first clock signal and generating a second clock signal, (b) a ring-type shift register for setting the delay time length of said digital delay line by flip-flop output of each stage thereof, and (c) a delay amount control unit for controlling supply of shift clocks to said ring-type shift register, based on phase relation between said first clock signal and said second clock signal; and
- a driving circuit for driving said display panel based on said second clock signal, wherein,
    - said digital delay line is a configuration of a serial connection of (a) a first delay line for coarse adjustment of delay time and (b) a second delay line for fine adjustment of delay time,
    - said ring-type shift register is a configuration of (a) a first ring-type shift register corresponding to said first delay line and (b) a second ring-type shift register corresponding to said second delay line,
    - said delay amount control unit is a configuration of (a) a first delay amount control unit corresponding to said first delay line and (b) a second delay amount control unit corresponding to said second delay line, and
    - said shift clock which drives said first and second ring-type shift registers has a frequency lower than said first clock signal or said second clock signal.

10. A display panel module according to claim 9, wherein active elements of said clock signal generating circuit are thin-film transistors formed or printed on an insulating substrate.

11. A display panel module according to claim 9, wherein said display panel is a liquid crystal panel.

12. An imaging apparatus comprising:
- an imaging device;
- a delay synchronization loop type clock signal generating circuit including (a) a digital delay line for delaying a first clock signal and generating a second clock signal, (b) a ring-type shift register for setting the delay time length of said digital delay line by flip-flop output of each stage thereof, and (c) a delay amount control unit for controlling supply of shift clocks to said ring-type shift register, based on phase relation between said first clock signal and said second clock signal; and
- a driving circuit for driving said imaging device based on said second clock signal,
- wherein,
    - said digital delay line is a configuration of a serial connection of (a) a first delay line for coarse adjustment of delay time and (b) a second delay line for fine adjustment of delay time,
    - said ring-type shift register is a configuration of (a) a first ring-type shift register corresponding to said first delay line and (b) a second ring-type shift register corresponding to said second delay line,
    - said delay amount control unit is a configuration of (a) a first delay amount control unit corresponding to said first delay line and (b) a second delay amount control unit corresponding to said second delay line, and
    - said shift clock which drives said first and second ring-type shift registers has a frequency lower than said first clock signal or said second clock signal.

13. Electronic equipment comprising:
- a delay synchronization loop type clock signal generating circuit including (a) a digital delay line for delaying a first clock signal and generating a second clock signal, (b) a ring-type shift register for setting the delay time length of said digital delay line by flip-flop output of each stage thereof, and (c) a delay amount control unit for controlling supply of shift clocks to said ring-type shift register, based on phase relation between said first clock signal and said second clock signal;
- a system control unit for controlling operations of the entire system; and an operation input unit for accepting operation input to said system control unit
- wherein,
    - said digital delay line is a configuration of a serial connection of (a) a first delay line for coarse adjustment of delay time and (b) a second delay line for fine adjustment of delay time,
    - said ring-type shift register is a configuration of (a) a first ring-type shift register corresponding to said first delay line and (b) a second ring-type shift register corresponding to said second delay line,
    - said delay amount control unit is a configuration of (a) a first delay amount control unit corresponding to said first delay line and (b) a second delay amount control unit corresponding to said second delay line, and
    - said shift clock which drives said first and second ring-type shift registers has a frequency lower than said first clock signal or said second clock signal.

* * * * *